US008399761B2

(12) United States Patent
Marks et al.

(10) Patent No.: US 8,399,761 B2
(45) Date of Patent: *Mar. 19, 2013

(54) ORGANIC PHOTOVOLTAIC DEVICE WITH INTERFACIAL LAYER AND METHOD OF FABRICATING SAME

(75) Inventors: Tobin J. Marks, Evanston, IL (US); Alexander W. Hains, Lakewood, CO (US)

(73) Assignee: Northwestern University, Evanston, IL (US)

( * ) Notice: Subject to any disclaimer, the term of this patent is extended or adjusted under 35 U.S.C. 154(b) by 356 days.

This patent is subject to a terminal disclaimer.

(21) Appl. No.: 12/771,376

(22) Filed: Apr. 30, 2010

(65) Prior Publication Data

US 2010/0252113 A1    Oct. 7, 2010

Related U.S. Application Data

(63) Continuation-in-part of application No. 12/046,929, filed on Mar. 12, 2008, now Pat. No. 7,799,990.

(60) Provisional application No. 60/906,456, filed on Mar. 12, 2007.

(51) Int. Cl.
H01L 31/00 (2006.01)

(52) U.S. Cl. ...................................................... 136/263

(58) Field of Classification Search ................... 136/263
See application file for complete search history.

(56) References Cited

U.S. PATENT DOCUMENTS

| | | | |
|---|---|---|---|
| 7,388,100 B2 | 6/2008 | Nishio | |
| 7,799,990 B2 * | 9/2010 | Marks et al. ................. | 136/263 |
| 2007/0028961 A1 | 2/2007 | Zhang et al. | |
| 2008/0100213 A1 | 5/2008 | Iwakuma et al. | |
| 2008/0223445 A1 | 9/2008 | Marks et al. | |
| 2009/0056810 A1 | 3/2009 | Marks et al. | |

OTHER PUBLICATIONS

Hains et al. Designed bithiophene-based interfacial layer for high-efficiency bulk-heterojunction organic photovoltaic cells. Importance of interfacial energy level matching. Applied materials & Interfaces. Dec. 7, 2009. p. 175-185. vol. 2, No. 1. Northwestern University, Illinois, United States of America.
Marrikar, F.S. et al., Modification of Indium-Tin Oxide Electrodes with Thiophene Copolymer Thin Films: Optimizing Electron Transfer to Solution Probe Molecules, Langmuir, 2007, vol. 23, 1530-1542.
Shrotriya. V. et al., Transition Metal Oxides as the Buffer Layer for Polymer Photovoltaic Cells, Appl. Phys. Lett., 2006, vol. 88, 073508-1-073508-3.
Brabec, C.J. et al., Effect of LiF/Metal Electrodes on the Performance of Plastic Solar Cells, Appl. Phys. Lett., 2002, vol. 80, 1288-1290.
Ahlswede, E. et al., Comparative Study of the Influence of LiF, NaF, and KF on the Performance of Polymer Bulk Heterjunction Solar Cells, Appl. Phys. Lett., 2007, vol. 90, 163504-1-163504-3.
Li, G. et al., Efficient Inverted Polymer Solar Cells, Appl. Phys. Lett., 2006, vol. 88, 253503-1-253503-3.
Peumans, P. et al., Very-High-Efficiency Double-Heterojunction Copper Phthalocyanine/C60 Photovoltaic Cells, Appl. Phys. Lett., 2001, vol. 79, 126-128.
Lee, T.-W. et al., Control of the Surface Composition of a Conducting-Polymer Complex Film to Tune the Work Function, Adv. Funct. Mater., 2008, vol. 18, 2246-2252.
de Kok, M.M. et al., Modification of PEDOT:PSS as Hole Injection Layer in Polymer LEDs, Phys. Status Solidi A, 2004, vol. 201, 1342-1359.
Brown, T.M. et al., Built-In Field Electroabsorption Spectroscopy of Polymer Light-Emitting Diodes Incorporating a Doped Poly(3,4-ehtylene dioxythiophene) Hole Injection Layer, Appl. Phys. Lett., 1999, vol. 75, 1679-1681.
Kemerink, M. et al., Three-Dimensional Inhomogeneities in PEDOT:PSS Films, J. Phys. Chem., 2004, vol. 108, 18820-18825.
Ionescu-Zanetti, C. et al., Semiconductive Polymer Blends: Correlating Structure with Transport Properties at the Nanoscale, Adv. Mater., 2004, vol. 16, 385-389.
de Jong, M.P. et al., Stability of the Interface Between Indium-Tin-Oxide and Poly(3,4-ethylenedioxythiophene)/Poly(styrenesulfonate) in Polymer Light-Emitting Diodes, Appl. Phys. Lett., 2000, vol. 77, 2255-2257.
Wong, K.W. et al., Blocking Reactions Between Indium-Tin Oxide and Poly(3,4-ethylenedioxythiophene):Poly(styrenesulfonate) with a Self-Assembly Monolayer, Appl. Phys. Lett., 2002, vol. 80, 2788-2790.
Ni, J. et al., MOCVD-Derived Highly Transparent, Conductive Zinc- and Tin-Doped Indium Oxide Thin Films: Precursor Synthesis, Metastable Phase Film Growth and Characterization, and Application as Anodes in Polymer Light-Emitting Diodes, J. Am. Chem. Soc., 2005, vol. 127, 5613-5624.
Greczynski, G. et al., Photoelectron Spectroscopy of Thin Films of PEDOT-PSS Conjugated Polymer Blend: A Mini-Review and Some New Results, J. Electron. Spectrosc. Relat. Phenom., 2001, vol. 121, 1-17.
Pangborn, A.B. et al., Safe and Convenient Procedure for Solvent Purification, Organometallics, 1996, vol. 15, 1518-1520.
Mozer, A.J. et al., Novel Regiospecific MDMO-PPV Copolymer with Improved Charge Transport for Bulk Heterojunction Solar Cells, J. Phys. Chem., 2004, vol. 108, 5235-5242.
Izadyar, A. et al., Electrochemistry and Electrogenerated Chemiluminescence of Quinoxaline Derivatives, J. Phys. Chem., 2008, vol. 112, 20027-20032.
Debad, J.D. et al., Anodic Coupling of Diphenylbenzo[k]fluoranthene: Mechanistic and Kinetic Studies Utilizing Cyclic Voltammetry and Electrogenerated Chemiluminescence, J. Org. Chem., 1997, vol. 62, 530-537.
Tonzola, C.J. et al., New n-Type Organic Semiconductors: Synthesis, Single Crystal Structures, Cyclic Voltammetry, Photophysics, Electron Transport, and Electroluminescenec of a Series of Diphenylanthrazolines, J. Am. Chem. Soc., 2003, vol. 125, 13548-13558.

(Continued)

*Primary Examiner* — Nathan M Nutter
(74) *Attorney, Agent, or Firm* — Morris, Manning & Martin, LLP; Tim Tingkang Xia, Esq.

(57) ABSTRACT

An organic photovoltaic device and method of forming same. In one embodiment, the organic photovoltaic device has an anode, a cathode, an active layer disposed between the anode and the cathode; and an interfacial layer disposed between the anode and the active layer, the interfacial layer comprising 5,5'-bis[(p-trichlorosilylpropylphenyl)phenylamino]-2,2'-bithiophene (PABTSi$_2$).

37 Claims, 14 Drawing Sheets

OTHER PUBLICATIONS

Kulkarni, A.P. et al., Electron Transport Materials for Organic Light-Emitting Diodes, Chem. Mater., 2004, vol. 16, 4556-4573.

Poriel, C. et al., Dispirofluorene-Indenofluorene Derivatives as New Building Blocks for Blue Organic Electroluminescent Devices and Electroactive Polymers, Chem. Eur. J., 2007, vol. 13, 10055-10069.

Shrotriya, V. et al., Accurate Measurement and Characterization of Organic Solar Cells, Adv. Funct. mater., 2006, vol. 16, 2016-2023.

Curtis, R.F. et al., The Synthesis of Monohalogeno-2,2'-Bitjienyls, J. Chem. Soc., 1965, 5134-5137.

Tour, J.M. et al., Synthesis and UV-Visible Properties of Soluble Thiophene Oligomers. Monomer to Octamer, Macromolecules, 1992, vol. 25, 1901-1907.

Irwin, M.D. et al., Consequences of Anode Interfacial Layer Deletion. HCl-Treated ITO in P3HT:PCBM-Based Bulk-Heteojunction Organic Photovoltaic Devices, Langmuir, 2010, vol. 26, 2584-2591.

Kong, J. et al., A High-Performance Ab Initio Electronic Structure Program Package, J. Comput. Chem., 2000, vol. 21, 1532-1548.

Maldonado, J-L et al., Effect of Substitution on the Hole Mobility of Bis(diarylamino)biphenyl Derivatives Doped in Poly(Styrene), Chem. Mater., 2003, vol. 15, 994-999.

Smeu, M. et al., Theoretical Investigation of Electron Transport Modulation Through Benzenedithiol by Substituent Groups, J. Chem. Phys., 2008, vol. 129, 034707-1-034707-8.

DiLabio, G.A. et al., Theoretical Calculation of Ionization Potentials for Disubstituted Benzenes: Additivity vs Non-Additivity of Substituent Effects, J. Org. Chem., 2000, vol. 65, 2195-2203.

Rohde, D. et al., Radical Ions of -Bis(diphenylamino)-capped Oligothiophenes: A Combined Spectroelectrochemical anf Theoretical Study, J. Phys. Chem., 2006, vol. 110, 8223-8231.

Li, J. et al., Characterization of Transparent Conducting Oxide Surfaces Using Self-Assembled Electroactive Monolayers, Langmuir, 2008, vol. 24, 5755-5765.

Huang, Q. et al., Triarylamine Siloxane Anode Functionalization/ Hole Injection Layers in High Efficiency / HighLuminance Small-Molecule Green- and Blue-Emitting Organic Light-Emitting Diodes, J. Appl. Phys., 2007, vol. 101, 093101-1-093101-13.

Cui, J. et al., Anode Interfacial Engineering Approaches to Enhancing Anode/Hole Transport Layer Interfacial Stability and Charge Injection Efficiency in Organic Light-Emitting Diodes, Langmuir, 2002, vol. 18, 9958-9970.

Louie, J. et al., Palladium-Catalyzed Synthesis of Arylamines from Aryl Halides. Mechanistic Studies Lead to Coupling in the Absence of Tin Reagents, Tetrahedron Lett., 1995, vol. 36, 3609-3612.

Guram, A.S. et al., A Simple Catalytic Method for the Conversion of Aryl Bromides to Arylamines, Angew. Chem. Int. Ed., 1995, vol. 34, 1348-1350.

Driver, M.S. et al., A Second-Generation Catalyst for Arly Halide Amination: Mixed Secondary Amines from Aryl Halides and Primary Amines Catalyzed by (DPPF)PdCl2, J. Am. Chem. Soc., 1996, vol. 118, 7217-7218.

Wolfe, J.P. et al., An Improved Catalyst System for Aromatic Carbon-Nitrogen Bond Formation: The Possible Involvement of Bis(Phosphine) Palladium Complexes as Key Intermediates, J. Am. Chem. Soc., 1996, vol. 118, 7215-7216.

Hartwig, J.F., Recent Advances in Palladium- and nickel- Catalyzed Chemistry Provide New Ways to Construct C-N and C-O Bonds, Angew. Chem. Int. Ed., 1998, vol. 37, 2046-2067.

Yang, B.H. et al., Palladium-Catalyzed Amination of Aryl Halides and Sulfonates, J. Organomet. Chem., 1999, vol. 576, 125-146.

Hooper, M.W. et al., Scope and Mechanism of Palladium-Catalyzed Amination of Five-Membered Heterocyclic Halides, J. Org. Chem., 2002, vol. 68, 2861-2873.

Haung, Q. et al., Systematic Investigation of Nanoscale Adsorbate Effects at Organic Light-Emitting Diode Interfaces. Interfacial Structure- Charge Injection- Luminance Relationships, Chem. Mater., 2006, vol. 18, 2431-2442.

Bard, A.J. et al., Electrochemical Methods: Fundamentals and Applications. 2nd ed.; John Wiley & Sons, Inc.: New York, NY, 2001.

Chambon, S. et al., Durability of MDMO-PPV and MDMO-PPV: PCBM Blends Under Illumination in the Absence of Oxygen, Sol. Energy. Mater. Sol. Cells., 2008, vol. 92, 785-792.

Shrotriya, V. et al., Absorption Spectra Modification in Poly(3-hexylthiophene): Methanofullerene Blend Thin Films, Chem. Phys. Lett., 2005, vol. 411, 138-143.

Mihailetchi, V.D. et al., Space-Charge Limited Photocurrent, Phys. Rev. Lett., 2005, vol. 94, 126602-1-126602-4.

Yan, H. et al., Organic Field-Effect Transistors Based on a Crosslinkable Polymer Blend as the Semiconducting Layer, Appl. Phys. Lett., 2005, vol. 87, 183501-1-183501-3.

Mihailetchi, V.D. et al., Cathode Dependence of the Open-Circuit Voltage of Polymer:Fullerene Bulk Heterojunction Solar Cells, J. Appl. Phys., 2003, vol. 94, 6849-6854.

Aernouts, T. et al., Extraction of Bulk and Contact Components of the Series Resistance in Organic Bulk Donor-Acceptor-Heterojunctions, Thin Solid Films, 2002, vol. 403-404, 297-301.

Smith, A.P. et al., An Investigation of Poly(thienylene vinylene) in Organic Photovoltaic Devices, Chem. Mater., 2004, vol. 16, 4687-4692.

Yang, X. et al., Toward High-Performance Polymer Solar Cells: The Importance of Morphology Control, Macromolecules, 2007, vol. 40, 1353-1362.

van Bavel, S.S. et al., Three-Dimensional Nanoscale Organization of Bulk Heterojunction Polymer Solar Cells, Nano. Lett., 2009, vol. 9, 507-513.

Mayer, A.C. et al., Bimolecular Crystals of Fullerenes in Conjugated Polymers and the Implications of Molecular Mixing for Solar Cells, Adv. Funct. Mater., 2009, vol. 19, 1173-1179.

Kim, Y. et al., Device Annealing Effect in Organic Solar Cells with Blends of Regioregular poly(3-hexylthiophene) and Soluble Fullerene, Appl. Phys. Lett., 2005, vol. 86, 063502-1-063502-3.

Bernede, J.C., Organic Photovoltaic Cells: History, Principle and Techniques, J. Chil. Chem. Soc., 2008, vol. 53, 1549-1564.

Vogel, M. et al., On the Function of a Bathocuproine Buffer Layer in Organic Photovoltaic Cells, Appl. Phys. Lett., 2006, vol. 89, 163501-1-163501-3.

* cited by examiner

US 8,399,761 B2

ORGANIC PHOTOVOLTAIC DEVICE WITH INTERFACIAL LAYER AND METHOD OF FABRICATING SAME

CROSS-REFERENCE TO RELATED PATENT APPLICATION

This application is a continuation-in-part of U.S. patent application Ser. No. 12/046,929, filed Mar. 12, 2008, entitled "Electron-Blocking Layer/Hole-Transport Layer For Organic Photovoltaics And Applications Of Same", by Tobin J. Marks, Alexander W. Haim, Michael D. Irwin and He Yan, the status of which is pending, which itself claims priority to U.S. Ser. No. 60/906,456, filed Mar. 12, 2007, the disclosures of which are incorporated herein in their entireties by reference.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references listed, cited, and/or discussed in this specification are incorporated herein by reference in their entireties and to the same extent as if each reference was individually incorporated by reference. In terms of notation, hereinafter, "(n)" represents the nth reference cited in the reference list. For example, (15) represents the 15$^{th}$ reference cited in the reference list, namely, Hains, A. W.; Marks, T. J. Appl. Phys. Lett. 2008, 92, 023504.

STATEMENT AS TO RIGHTS UNDER FEDERALLY-SPONSORED RESEARCH

This invention was made with government support under Grant No. DE-FG02-08ER46536/A000 awarded by Department of Energy and Grant No. N00014-08-1-0923 awarded by the Office of Naval Research. The government has certain rights in the invention.

FIELD OF THE INVENTION

The present invention relates generally to an organic photovoltaic device, and more particularly to an organic photovoltaic device that has an interfacial layer comprising 5,5'-bis [(p-trichlorosilylpropylphenyl)phenylamino]-2,2'-bithiophene (PABTSi$_2$), and methods of making same.

Organic photovoltaic (OPV) cells have been the subject of intense research and development in the past several years (1-9). This interest reflects the fact that OPVs may offer many potential attractions for solar power conversion, such as the use of low-cost, light-weight plastic materials; compatibility with flexible substrates; and the adaptability to inexpensive, low-temperature, large-area, solution-based processing techniques, including spin-coating and doctor-blading, as well as roll-to-roll and inkjet printing. Since the pioneering vapor-deposited donor/acceptor (D/A) bilayer devices reported by Tang in 1986, having power conversion efficiencies ($\eta_p$) of 1% (10), the physical/mechanistic understanding of OPV function and reported power conversion efficiencies have progressed dramatically. In 1995, the first bulk-heterojunction (BHJ) OPVs were reported (11-13). This cell architecture increases the fraction of photogenerated excitons able to separate into free holes and electrons by significantly reducing the required mean exciton diffusion length, which is accomplished by creating numerous phase-separated D/A interfaces throughout the active layer rather than relying on a single interface. The BHJ cell design has been widely adopted and used with numerous active layer materials to increase OPV efficiency (1, 3, 4). Notably, cells employing polyphenylene vinylenes or polythiophenes as electron donors and soluble fullerenes as electron acceptors have been extensively studied. Poly[2-methoxy-5-(3',7'-dimethyloctyloxy)]-1,4-phenylene vinylene (MDMO-PPV):[6,6]-phenyl-C$_{61}$-butyric acid methyl ester (PCBM) cells have achieved efficiencies as high as about 2.5% (14, 15), while poly(3-hexylthiophene) (P3HT):PCBM OPV efficiencies are even higher, with several groups reporting about 5% (chemical structures as shown in FIG. 1($a$)) (16-19). If OPV power conversion efficiencies can be brought to 10%, as various studies have argued appears well within reach (20-23), "plastic" solar cells could become commercially viable (24).

An important consideration in advancing OPV understanding and ultimate efficiency is optimizing the interactions between the various functional BHJ layers. Improved understanding of OPV interfacial interactions should provide insight into processes that limit current $\eta_p$ values to well below theoretical photon-to-electricity conversion efficiencies. These processes include electron-hole recombination (9, 25-30), charge leakage due to imperfect diodes (15, 18, 25, 31, 32), inefficient exciton scission (26, 33-35), and surface energy mismatches which lead to interfacial dewetting/delamination (36-40). The importance of such interfacial phenomena has been previously demonstrated in other optoelectronic devices such as organic light-emitting diodes (OLEDs). In OLEDs, for example, insertion of a hole transport/electron-blocking layer (HTL/EBL) between the hole-injecting transparent conducting oxide (TCO) anode and the organic emissive layer (EML) both promotes hole injection as well as prevents injected electrons from transiting without radiative recombination, and confines them to the EML for radiative recombination, which significantly increases the device efficiency (41-44).

In BHJ OPVs, interfacial layers (IFLs) have been used at both the cathode and anode sides of the active layer.(15, 18, 25, 45-53) A thin LiF layer is typically deposited before the Al cathode (54, 55), a practice that will be employed consistently in this work, and poly(3,4-ethylenedioxythiophene): poly(styrene sulfonate) (PEDOT:PSS, FIG. 1) is usually applied directly to the TCO anode, typically Sn-doped In$_2$O$_3$ (ITO), prior to active layer deposition (4). The benefits of IFLs such as PEDOT:PSS in OPVs include creation of an Ohmic contact (56), planarization of ITO surface "spikes" (57-59), increased open-circuit voltage ($V_{oc}$) (25, 57), and improved hole collection (60). PEDOT:PSS drawbacks include large electrical and microstructural inhomogeneities that lead to widely varying conductivities and morphologies across the film surface, anisotropic conductivity that can lead to crosstalk between adjacent devices on a substrate, and pH about 1 that can corrode the underlying ITO (2, 42, 61-65). Furthermore, PEDOT:PSS acidity effects are exacerbated at the high temperatures (66) inherent to most OPV operation, making PEDOT:PSS a non-optimum IFL.

Therefore, a heretofore unaddressed need exists in the art to address the aforementioned deficiencies and inadequacies.

SUMMARY OF THE INVENTION

In one aspect, the present invention provides an organic photovoltaic device. In one embodiment, the organic photovoltaic device has an anode, a cathode, an active layer disposed between the anode and the cathode; and an interfacial layer disposed between the anode and the active layer, the interfacial layer comprising 5,5'-bis[(p-trichlorosilylpropylphenyl) phenylamino]-2,2'-bithiophene (PABTSi$_2$).

The active layer comprises poly(3-hexylthiophene) (P3HT). In one embodiment, the active layer further comprises [6,6]-phenyl-C$_{61}$-butyric acid methyl ester (PCBM), wherein the ratio of P3HT and PCBM is about 1:1 by weight.

The interfacial layer further comprises poly[9,9-dioctylfluorene-co-N-[4-(3-methylpropyl)]-diphenylamine] (TFB), wherein PABTSi$_2$ and TFB are cross-linked and blended. In one embodiment, the ratio of PABTSi$_2$ and TFB is less than 1 by weight. In another embodiment, the ratio of PABTSi$_2$ and TFB is about 1:2. In yet another embodiment, the ratio of PABTSi$_2$ and TFB is about 1:3.

In one embodiment, the interfacial layer has a thickness in the range between about 20 nm and 50 nm.

In one embodiment, the anode comprises indium tin oxide (ITO).

In one embodiment, the cathode comprises aluminum (Al).

In one embodiment, the organic photovoltaic device further has a layer of lithium fluoride (LiF) disposed between the active layer and the cathode.

In another aspect, the present invention provides a method of fabricating an organic photovoltaic device. In one embodiment, the method has the steps of:

forming an anode;

depositing an interfacial layer on the anode, the interfacial layer comprising 5,5'-bis[(p-trichlorosilylpropylphenyl)phenylamino]-2,2'-bithiophene (PABTSi$_2$);

depositing an active layer on the interfacial layer; and forming a cathode on the active layer.

In a further aspect, the present invention provides an article of manufacture. In one embodiment, the article of manufacture has a layer that comprises 5,5'-bis[(p-trichlorosilylpropylphenyl) phenylamino]-2,2'-bithiophene (PABTSi$_2$).

These and other aspects of the present invention will become apparent from the following description of the preferred embodiment taken in conjunction with the following drawings and their captions, although variations and modifications therein may be affected without departing from the spirit and scope of the novel concepts of the disclosure.

DETAILED DESCRIPTION

Figure 1A:
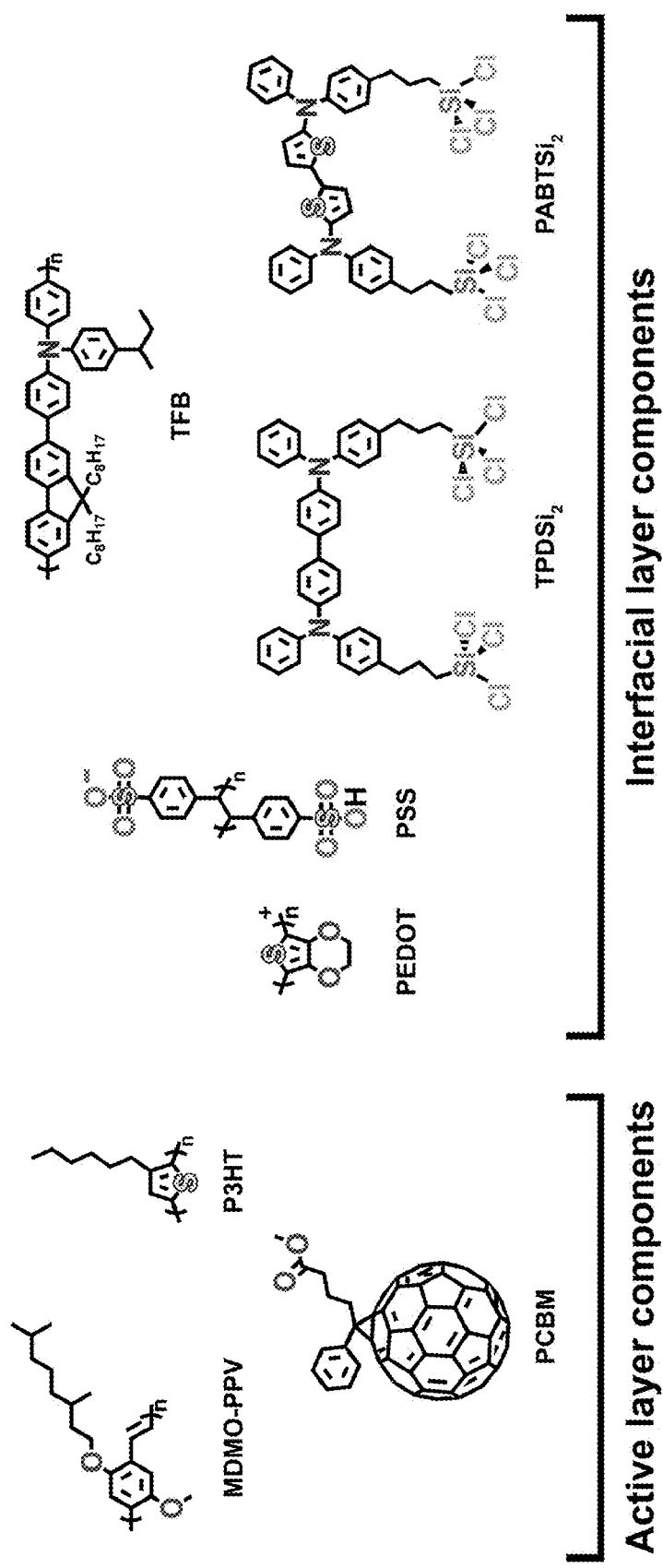
FIG. 1 shows (a) structures and abbreviations of active and interfacial layer components utilized in various embodiments of the present invention; (b) a depiction of TPDSi$_2$ Covalent Bonding to Hydroxylated ITO Surface; and (c) a depiction of crosslinking

The present invention is more particularly described in the following examples that are intended as illustrative only since numerous modifications and variations therein will be apparent to those skilled in the art. Various embodiments of the invention are now described in detail. Referring to the drawings, FIGS. 1-12, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, if any, the term "atomic force microscope (AFM)" or scanning force microscope (SFM) refers to a very high-resolution type of scanning probe microscope, with demonstrated resolution of fractions of a nanometer, more than 1000 times better than the optical diffraction limit. The term "microscope" in the name of "AFM" is actually a misnomer because it implies looking, while in fact the information is gathered or the action is taken by "feeling" the surface with a mechanical probe. The AFM in general has a microscale cantilever with a tip portion (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. The AFM can be utilized in a variety of applications.

As used herein, if any, the term "transmission electron microscopy (TEM)" refers to a microscopy technique whereby a beam of electrons is transmitted through an ultra thin specimen, interacting with the specimen as it passes through it. An image is formed from the electrons transmitted through the specimen, magnified and focused by an objective lens and appears on an imaging screen, a fluorescent screen in most TEMs, plus a monitor, or on a layer of photographic film, or to be detected by a sensor such as a CCD camera.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "scanning tunneling microscope (STM)" is a technique for viewing surfaces at the atomic level. STM probes the density of states of a material using tunneling current. The STM is based on the concept of quantum tunneling. When a conducting tip is brought very near to a metallic or semiconducting surface, a bias between the two can allow electrons to tunnel through the vacuum between them. For low voltages, this tunneling current is a function of the local density of states (LDOS) at the Fermi level, $E_f$, of the sample. Variations in current as the probe passes over the surface are translated into an image.

As used herein, if any, the term "X-ray diffraction (XRD)" refers to one of X-ray scattering techniques that are a family of non-destructive analytical techniques which reveal information about the crystallographic structure, chemical composition, and physical properties of materials and thin films. These techniques are based on observing the scattered intensity of an X-ray beam hitting a sample as a function of incident and scattered angle, polarization, and wavelength or energy. In particular, X-ray diffraction finds the geometry or shape of a molecule, compound, or material using X-rays. X-ray diffraction techniques are based on the elastic scattering of X-rays from structures that have long range order. The most comprehensive description of scattering from crystals is given by the dynamical theory of diffraction.

As used herein, "plurality" means two or more.

As used herein, the terms "comprising," "including," "carrying," "having," "containing," "involving," and the like are to be understood to be open-ended, i.e., to mean including but not limited to.

OVERVIEW OF THE INVENTION

The present invention provides, among other things, a novel and more suitable IFL to address many, if not all, of the deficiencies the existing technologies have.

Figures 1B, 1C:
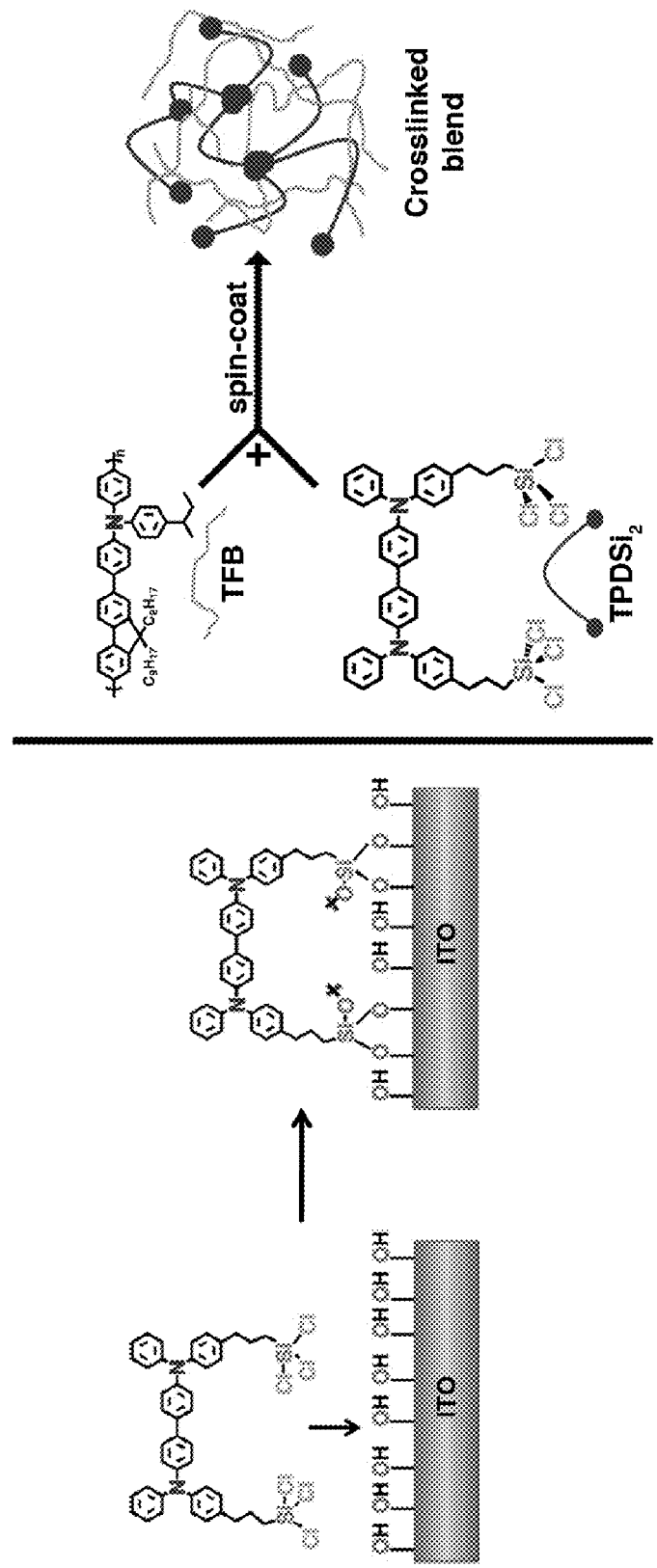

In particular, an IFL having a crosslinked blend of 4,4'-bis [(p-trichlorosilylpropylphenyl)-phenylamino]biphenyl (TPDSi$_2$) and poly[9,9-dioctylfluorene-co-N-[4-(3-methylpropyl)]-diphenylamine] (TFB), as shown in FIG. 1(a), was recently implemented in MDMO-PPV:PCBM OPVs, both in conjunction with, and as a replacement for, PEDOT:PSS (15, 25). This IFL functions as an HTL/EBL, which allows collection of photogenerated holes at the anode, but suppresses undesired electron leakage/recombination at the anode. Compared to PEDOT:PSS, this IFL displays superior charge blocking characteristics, excellent thermal stability, and better electrode adhesion due to covalent bonding to the ITO surface, as shown in FIGS. 1(b) and 1(c), while maintaining high hole mobility (FET $\mu_h$=5×10$^{-4}$ cm$^2$/V·s), good optical transparency throughout the visible region of the spectrum, and insolubility in organic solvents, which allows subsequent active layer deposition from solution.

Figure 2A:
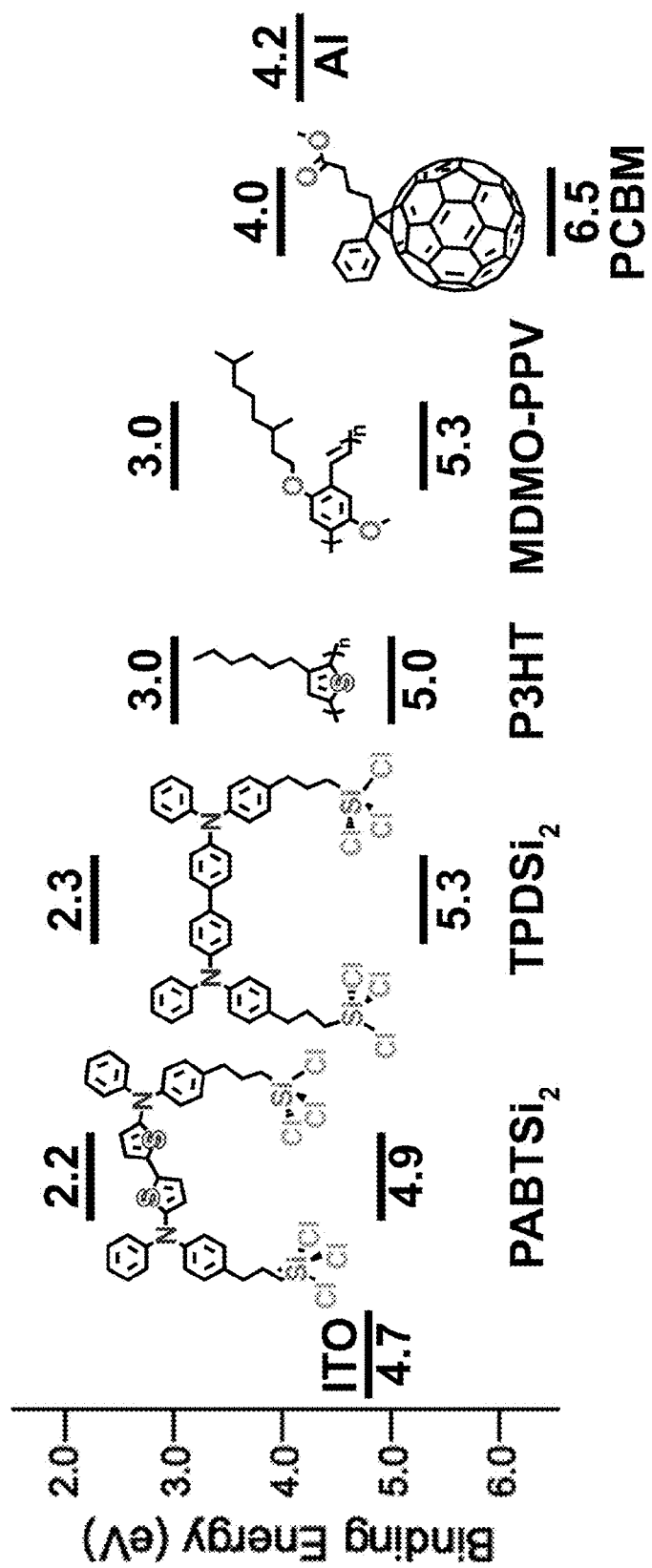
FIG. 2 shows (a) energy level diagram depicting HOMO and LUMO energies of OPV device component materials, including that of the novel IFL, PABTSi$_2$, according to various embodiments of the present invention; and (b) a synthetic route to PABTSi$_2$ according to one embodiment of the present invention.
Figure 2B:
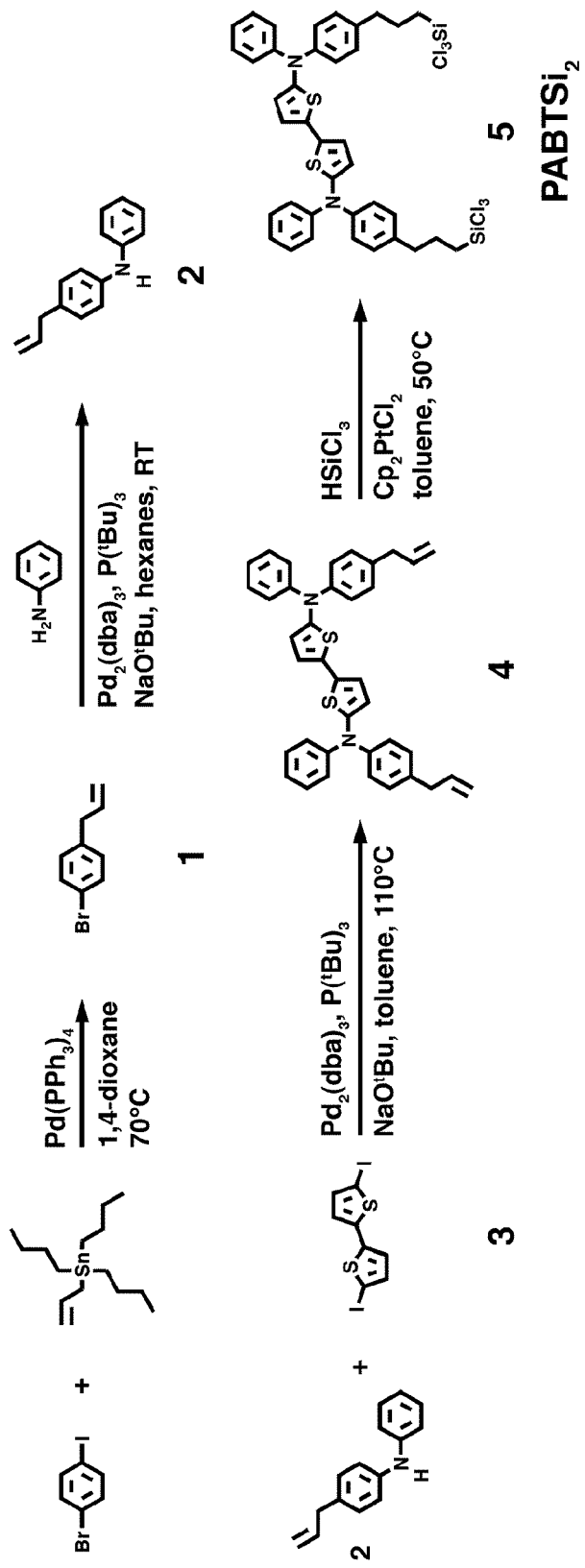
Figure 3:
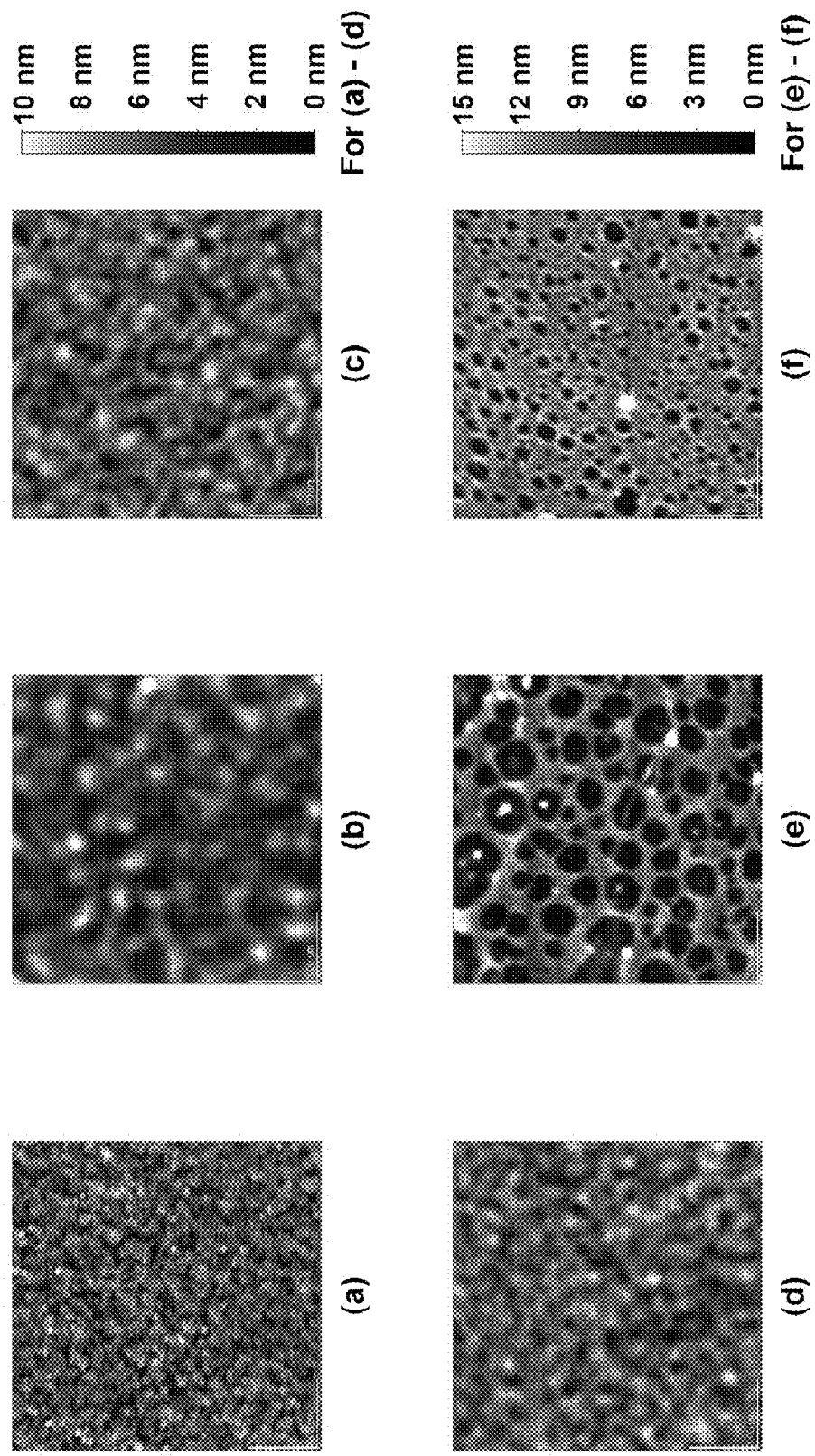
FIG. 3 shows Tapping mode AFM images of: (a) bare ITO (RMS roughness=1.4 nm); (b) unannealed PABTSi$_2$ derived film spin-coated from toluene (0.7 nm); (c) unannealed PABTSi$_2$:TFB (1:1)-derived film spin-coated from toluene (0.5 nm); (d) 135° C. annealed PABTSi$_2$:TFB (1:1)-derived film spin-coated from toluene (0.6 nm); (e) 135° C.-annealed PABTSi$_2$:TFB (1:1)-derived film spin-coated from CB (3.2 nm); (f) 135° C.-annealed PABTSi$_2$:TFB (1:2)-derived film spin-coated from CB (2.2 nm). Scans (a)-(d) are 4.5×4.5 µm images with height (z)=0-10 nm; scans (e) and (f) are 9×9 µm images with z=0-15 nm according to various embodiments of the present invention, respectively.

While TPDSi$_2$ substantially increases MDMO-PPV: PCBM OPV $V_{oc}$, and $\eta_p$ metrics versus cells with no IFL or those with a PEDOT:PSS IFL, it curiously does not achieve similar enhancements for higher-performing P3HT:PCBM BHJ OPVs. It is possible that this reflect an energy level mismatch between the TPDSi$_2$ and P3HT HOMO energies, as shown in FIG. 2(a). If the scheme shown in FIG. 2(a) is valid, a P3HT:PCBM-compatible IFL would require a crosslinkable p-type semiconductor having substantial hole mobility, excellent chemical and thermal stability, good optical transparency, a high-lying LUMO to block misdirected electrons, and, importantly, a HOMO energetically positioned at or slightly above the P3HT HOMO to ensure facile hole extraction.

Thus, among other things, the present invention provides the design, synthesis, characterization, and BHJ OPV implementation of such an IFL, 5,5'-bis[(p-trichlorosilylpropylphenyl) phenylamino]-2,2'-bithiophene (PABTSi$_2$, FIG. 2(a)). It was invented and is herein disclosed that, in particular, a thin layer of a PABTSi$_2$:TFB blend applied to the OPV anode is effective in producing P3HT:PCBM solar cell power conversion efficiencies rivaling those of analogous PEDOT:PSS-based cells. More specifically, in various embodiments, the present invention provides the design, synthesis, characterization, and organic photovoltaic (OPV) device implementation of a novel interfacial layer (IFL) for insertion between the anode and active layer of poly(3-hexylthiophene) (P3HT): [6,6]-phenyl-C$_{61}$-butyric acid methyl ester (PCBM) bulk-heterojunction solar cells. The IFL precursor, 5,5'-bis[(p-trichlorosilylpropylphenyl) phenylamino]-2,2'-bithiophene (PABTSi$_2$), covalently anchors to the ITO surface via the —SiCl$_3$ groups and incorporates a bithiophene unit to align the HOMO energy with that of P3HT (5.0 eV). The synthesis and subsequent electrochemical analysis of PABTSi$_2$ indicates a HOMO energy of 4.9 eV, while the LUMO level remains sufficiently high, at 2.2 eV, to effectively block electron leakage to the OPV ITO anode. For the P3HT:PCBM OPV fabrication, PABTSi$_2$ is used as a spin-coated crosslinked (via —SiCl$_3$ hydrolysis and condensation) 1:2 blend with poly[9,9-dioctylfluorene-co-N-[4-(3-methylpropyl)]-diphenylamine] (TFB). Such new and innovative devices exhibit an average power conversion efficiency of 3.14%, a fill factor of 62.7%, an open-circuit voltage of 0.54 V, and a short-circuit current of 9.31 mA/cm$^2$, parameters rivaling those of optimized PEDOT:PSS-based devices.

Thus, in one aspect, the present invention provides an organic photovoltaic device. In one embodiment, the organic photovoltaic device has an anode, a cathode, an active layer disposed between the anode and the cathode; and an interfacial layer disposed between the anode and the active layer, the interfacial layer comprising 5,5'-bis[(p-trichlorosilylpropylphenyl) phenylamino]-2,2'-bithiophene (PABTSi$_2$).

The active layer comprises poly(3-hexylthiophene) (P3HT). In one embodiment, the active layer further comprises [6,6]-phenyl-C$_{61}$-butyric acid methyl ester (PCBM), wherein the ratio of P3HT and PCBM is about 1:1 by weight.

The interfacial layer further comprises poly[9,9-dioctylfluorene-co-N-[4-(3-methylpropyl)]-diphenylamine] (TFB), wherein PABTSi$_2$ and TFB are cross-linked and blended. In one embodiment, the ratio of PABTSi$_2$ and TFB is less than 1 by weight. In another embodiment, the ratio of PABTSi$_2$ and TFB is about 1:2. In yet another embodiment, the ratio of PABTSi$_2$ and TFB is about 1:3.

In one embodiment, the interfacial layer has a thickness in the range between about 20 nm and 50 nm.

In one embodiment, the anode comprises indium tin oxide (ITO).

In one embodiment, the cathode comprises aluminum (Al).

In one embodiment, the organic photovoltaic device further has a layer of lithium fluoride (LiF) disposed between the active layer and the cathode.

In another aspect, the present invention provides a method of fabricating an organic photovoltaic device. In one embodiment, the method has the steps of:
forming an anode;
depositing an interfacial layer on the anode, the interfacial layer comprising 5,5'-bis[(p-trichlorosilylpropylphenyl) phenylamino]-2,2'-bithiophene (PABTSi$_2$);
depositing an active layer on the interfacial layer; and
forming a cathode on the active layer.

The active layer comprises poly(3-hexylthiophene) (P3HT). In one embodiment, the active layer further comprises [6,6]-phenyl-C$_{61}$-butyric acid methyl ester (PCBM), wherein the ratio of P3HT and PCBM is about 1:1 by weight.

The interfacial layer further comprises poly[9,9-dioctylfluorene-co-N-[4-(3-methylpropyl)]-diphenylamine] (TFB), wherein PABTSi$_2$ and TFB are cross-linked and blended. In one embodiment, the ratio of PABTSi$_2$ and TFB is less than 1 by weight. In another embodiment, the ratio of PABTSi$_2$ and TFB is about 1:2. In yet another embodiment, the ratio of PABTSi$_2$ and TFB is about 1:3.

In one embodiment, the interfacial layer has a thickness in the range between about 20 nm and 50 nm.

In one embodiment, the anode comprises indium tin oxide (ITO).

In one embodiment, the cathode comprises aluminum (Al).

In one embodiment, the step of depositing an interfacial layer comprises the step of spin-coating a film of PABTSi$_2$:TFB on the anode using a solvent. In one embodiment, the solvent is chlorobenzene (CB).

In one embodiment, the step of depositing an interfacial layer further comprises annealing the film at an annealing temperature above 20° C. subsequent to the step of spin-coating. The annealing temperature is between about 60° C. and 150° C.

In one embodiment, the step of depositing an active layer comprises the step of spin-coating a film of P3HT:PCBM on the interfacial layer using o-dichlorobenzene (ODCB) as a solvent.

In one embodiment, the method further has the step of depositing a layer of lithium fluoride (LiF) on the active layer prior to forming a cathode.

In another aspect, the present invention provides an article of manufacture made by the method set forth immediately above.

In one aspect, the present invention provides an article of manufacture. In one embodiment, the article of manufacture has a layer that comprises 5,5'-bis[(p-trichlorosilylpropylphenyl) phenylamino]-2,2'-bithiophene (PABTSi$_2$).

In one embodiment, the layer further comprises poly[9,9-dioctylfluorene-co-N-[4-(3-methylpropyl)]-diphenylamine] (TFB). PABTSi$_2$ and TFB are cross-linked and blended.

In one embodiment, the article of manufacture is an organic field-effect transistor.

In one embodiment, the article of manufacture has an organic field-effect transistor that has the layer as set forth immediately above.

Additional details are set forth below.

EXAMPLES

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

Example 1

Materials and Methods. Anhydrous toluene, hexanes, and pentane for syntheses were purchased from Aldrich in Pure-Pac containers and passed through a Grubbs column system (67) to further remove water and oxygen. TFB and TPDSi$_2$ were synthesized and purified according to the procedures of Yan et al. (42) and Huang et al. (43), respectively. PCBM was purchased from American Dye Source, Inc. (ADS). It was purified by several cycles of sonication in toluene followed by centrifugation, and then sonication in pentane followed by centrifugation. MDMO-PPV was synthesized according to the procedure of Mozer et al. (68) and was purified by repeated precipitation from methanol. P3HT was purchased from Rieke Metals, Inc. and was purified by sequential Soxhlet extractions with methanol and hexanes. Anhydrous chlorobenzene (CB) and anhydrous o-dichlorobenzene (ODCB) were purchased from Aldrich and were distilled from $P_2O_5$. PEDOT:PSS (1:6 by weight) was purchased from H. C. Starck under the name Baytron P VP AI 4083, stored in the dark at 4° C., and used as received. Aluminum slugs (99.999%) were purchased from Sigma-Aldrich, LiF (99.98%) was purchased from Acros, and both were used as received. ITO-coated glass substrates (10.5Ω/□, RMS roughness=1.60-2.34 nm) were purchased from Delta Technologies Ltd. in 25×75 mm strips. The UV-curable epoxy ELC-2500 used for device encapsulation was purchased from Electro-lite Corp. All other materials were used as received unless otherwise specified. NMR spectra were recorded on Varian 500 MHz instruments. High-resolution mass spectrometry (HRMS) was performed using a ThermoFinnigan MAT 900 XL mass spectrometer. Elemental analyses were performed by Midwest Microlabs, LLC. Optical absorption spectra were obtained with Varian Cary 5000 UV-Vis-NIR spectrophotometer. Cyclic voltammetry (CV) measurements were carried out at a scan rate of 100 mV/s with a platinum working electrode in acetonitrile with 0.1 M tetrabutylammonium hexafluorophosphate ($Bu_4N^+PF_6^-$) as the electrolyte. A platinum counter electrode and a silver pseudo-reference electrode were used with the ferrocene/ferrocenium ($Fc/Fc^+$) redox couple as the internal standard. The electrochemical potentials obtained in reference to the silver electrode were converted to the standard calomel electrode (SCE) scale using $$E_{Fc/Fc^+}°=0.424$$

V versus SCE (69, 70), and the oxidation potentials measured were converted to HOMO energies using the standard relationship IP (ionization potential)=

$$E_{onset}^{ox}+4.4$$

eV (71-73). Film thicknesses were measured with a stylus-based Tencor P10 surface profiler. At least two scans per film location were averaged to obtain thicknesses, and at least two locations on the film were tested to ensure reproducibility of results. A JEOL JSPM-5200 atomic force microscope was used to characterize film morphologies via atomic force microscopy (AFM). Images were recorded using the tapping mode in ambient with Applied NanoStructures ACTA Si cantilevers having $n^+$-Si tetrahedral tips with a 5-6 nm radius of curvature. Several locations of the film were examined to ensure reproducibility, and the root-mean-square (RMS) roughness scans are reported over 4.5×4.5 µm or 9×9 µm areas. Current density-voltage (J-V) plots of solar cells were obtained using a Spectra Nova Technologies class A solar cell analyzer with a Xe lamp that simulates AM1.5G light from 400-1000 nm at 1000 W/m². Four-point contacts were made to test devices, and all tests were carried out in ambient at 25° C. Devices were masked before testing to ensure no additional current was obtained from outside the designated solar cell area being examined. The analyzer was calibrated using a Si solar cell fitted with a KG3 filter that was tested and certified by the National Renewable Energy Laboratory (NREL). The KG3 filter accounts for differences in spectral response of silicon and organic polymers, and it ensures that the spectral mismatch correction factor approaches unity (74).

Example 2

Synthesis of 1-Allyl-4-bromobenzene (Compound 1). In a Stille coupling reaction, 1-bromo-4-iodobenzene and allyltri-n-butyltin were reacted to yield Compound 1. Thus, tetrakistriphenylphosphine palladium(0) (1.976 g, $1.710 \times 10^{-3}$ mol) was weighed out in a nitrogen-filled glove box and transferred to a Schlenk line. Allyltri-n-butyltin (10.60 mL, $3.419 \times 10^{-2}$ mol) and 1-bromo-4-iodobenzene (9.680 g, $3.422 \times 10^{-2}$ mol) were added along with 115 mL distilled, degassed 1,4-dioxane to yield a yellow reaction mixture that darkened to orange as the reaction progressed. The reaction mixture was stirred at 70° C. for 46 h until analysis by TLC (hexanes) and GC/MS showed that reaction was complete. The mixture was next cooled to room temperature, filtered through Celite (rinsing with hexanes), and resulting solution washed with both hexanes and water, to remove $PPh_3$. Then the organic portion was dried over $MgSO_4$. Filtration through Celite and removal of the solvent in a rotary evaporator at <75° C. yielded an orange oil. Column chromatography on silica gel with hexanes as eluant afforded only Compound 1 and tri-n-butyltin iodide. These were separated via vacuum distillation at 160 mTorr, where Compound 1 distills at about 50° C. (never exceed 75° C., which can potentially cause allyl group isomerization) as a clear colorless oil (2.810 g, 42% yield). GC/MS: single peak; m/z (rel. intensity) 198 ($M^+$, 46), 196 ($M^+$, 46), 117 (100), 115 (86). $^1H$ NMR ($CDCl_3$): δ7.41 (d, J=8.5 Hz, 2H), 7.07 (d, J=8.0 Hz, 2H), 5.90 (m, 1H), 5.09 (m, 2H), 3.36 (d, J=7.0 Hz, 2H).

Example 3

Synthesis of N-(4-Allylphenyl)phenylamine (Compound 2). Tris(dibenzylideneacetone)dipalladium(0) [$Pd_2(dba)_3$, 0.2623 g, $2.864 \times 10^{-4}$ mol] and tri-tert-butylphosphine (0.11 g, $5.437 \times 10^{-4}$ mol) were weighed out in a glove box, transferred to a Schlenk line, and stirred for about 5 min in hexanes before adding sodium tert-butoxide (2.000 g, $2.081 \times 10^{-2}$ mol) as a slurry in hexanes, Compound 1 (2.810 g, $1.426 \times 10^{-2}$ mol), and 80 mL hexanes. Next, distilled aniline (1.43 mL, $1.57 \times 10^{-2}$ mol) was added over a period of about 3 min with stirring. A brown precipitate formed after about 5 min at room temperature, and stirring was halted after 2 h. The mixture was then filtered through Celite, and the hexanes were removed in vacuo at ≦45° C. so as to minimize allyl group isomerization. The resulting oil was then placed in a freezer at −23° C. for 1 h to solidify. The resulting solid was then recrystallized from pentane to yield light tan crystals of Compound 2 (2.43 g, 82% yield) that were collected by filtration and rinsed 3× with cold pentane. GC/MS: single peak; m/z (rel. intensity) 210 ($M^+$ +H, 17), 209 ($M^+$, 100), 208 ($M^+$ −H, 29), 182 (38) 117 (33). $^1H$ NMR ($CDCl_3$): δ7.24 (m, 2H), 7.09 (d, J=8.5 Hz, 2H), 7.04 (d, J=6.5 Hz, 2H), 7.03 (d, J=6.5 Hz, 2H), 6.89 (t, J=7 Hz, 1 H), 5.94 (m, 1H), 5.64 (s, 1H), 5.06 (m, 2H), 3.34 (d, J=6.5 Hz, 2H). $^{13}C$ NMR ($CD_2Cl_2$): δ144.0, 141.4, 138.4, 133.3, 129.7, 129.6, 120.7, 118.7, 117.3, 115.5, 39.8. EA for $C_{15}H_{15}N$: Calc. %: C, 86.08; H, 7.22; N, 6.69; Found %: C, 85.95; H, 7.11; N, 6.82.

Example 4

Synthesis of 5,5'-Diiodo-2,2'-bithiophene (Compound 3). This modified synthesis (75, 76) was performed as detailed below. Sublimed $I_2$ (4.589 g, $1.808 \times 10^{-2}$ mol) and the catalyst red HgO (3.909 g, $1.805 \times 10^{-2}$ mol) were added alternatively, in small portions over a period of 1 h, to a stirring solution of bithiophene (1.536 g, $9.24 \times 10^{-3}$ mol) in 40 mL anhydrous benzene at 0° C. and then allowed to warm to room temperature and stir overnight. Another portion of $I_2$ (0.530 g, $2.09 \times 10^{-3}$ mol) was next added at room temperature, and the red-orange solution was again allowed to stir overnight. The reaction mixture was then diluted with about 100 mL CHCl$_3$ and washed with saturated aqueous KI solution (3×20 mL) and saturated aqueous sodium thiosulfate solution (3×20 mL) to remove excess I$_2$. The organic phase was then washed once with water, twice with brine, and dried over MgSO$_4$. The MgSO$_4$ was then removed by filtration, and the solvents were removed by rotary evaporation. Recrystallization of the residue from chloroform:ethanol (6:1) yielded 2.14 g of Compound 3 as light tan crystals. The solvent was removed from the mother liquor via rotary evaporation, and the resultant solid yielded another 0.67 g of Compound 3 after a second recrystallization, totaling 2.82 g (73% yield) of Compound 3 as light tan crystals. GC/MS: single peak; m/z (rel. intensity) 420 (M$^+$ +2H, 9), 419 (M$^+$ +H, 10), 418 (M$^+$ 100), 291 (8), 247 (20), 164 (17). m.p.=164° C. $^1$H NMR (CDCl$_3$): δ7.14 (d, J=3.5 Hz, 2H), 6.78 (d, J=3.5 Hz, 2H). EA for C$_8$H$_4$S$_2$I$_2$: Calc. %: C, 22.98; H, 0.96; Found %: C, 23.08; H 1.04.

Example 5

Synthesis of 5,5'-Bis [(p-allylphenyl)phenylamino]-2,2'-bithiophene (Compound 4). Pd$_2$(dba)$_3$ (26.5 mg, 2.89×10$^{-5}$ mol) and tri(tert-butyl)phosphine (6.5 mg, 3.2×10$^{-5}$ mol) were weighed out in a glove box and dissolved in about 5 mL toluene. After stirring for about 5 min, these were added to a flask containing Compound 2 (0.603 g, 2.88×10$^{-3}$ mol), Compound 3 (0.300 g, 7.16×10$^{-4}$ mol), and sodium tert-butoxide (0.207 g, 2.15×10$^{-3}$ mol) in about 80 mL anhydrous, anaerobic toluene, and the mixture was refluxed for 2 h until TLC (hexanes:toluene, 9:1) and GC/MS indicated that the reaction was complete. The mixture was then cooled to room temperature, filtered, and the solvent removed in vacuo at <40° C. The product was purified via column chromatography on silica gel, deactivated with 2 wt. % triethylamine, using hexanes:toluene (9:1) as the eluent. The solvent was then removed in vacuo at <40° C., leaving Compound 4 as a strongly-fluorescent yellow solid that was dried overnight under vacuum (0.195 g, 3.36×10$^{-4}$ mol, 47% yield). MALDI: m/z (rel. intensity) 582.4 (M$^+$ +2H, 39), 581.8 (M$^+$ +H, 77), 580.8 (M$^+$, 100). $^1$H NMR (CD$_2$Cl$_2$): δ7.46-6.96 (m, 22H), 5.95 (m, 2H), 5.06 (m, 4H), 3.37 (d, J=6.5 Hz, 4H). EA for C$_{38}$H$_{32}$N$_2$S$_2$: Calc. %: C, 78.58; H, 5.55; N, 4.82; Found %: C, 78.04; H, 5.68; N 4.37.

Example 6

Synthesis of 5,5'-Bis[(p-trichlorosilylpropylphenyl)phenylamino]-2,2'-bithiophene (Compound 5, PABTSi2). Excess HSiCl$_3$ (0.09 mL, 8.609×10$^{-4}$ mol) and a few grains of dicyclopentadienylplatinum(II) chloride (Cp$_2$PtCl$_2$) catalyst were added in a glove box to a solution of Compound 4 (0.050 g, 8.609×10$^{-5}$ mol) in about 10 mL anhydrous toluene. The solution was transferred to a Schlenk line where it was heated to 60° C. with stirring and left under static N$_2$ to prevent evaporation of the HSiCl$_3$. The reaction progress was monitored by $^1$H NMR, and cooled to room temperature after 42 h. Toluene and excess HSiCl$_3$ were next removed in vacuo. Upon trituration of the crude product with 15 mL of a dry 1:1 toluene:pentane solution, a solid formed and was removed via cannula filtration.

The supernatant was then pumped in vacuo to yield a yellow solid Compound 5 (0.072 g, 99% yield). $^1$H NMR (CDCl$_3$): δ7.40-6.90, (m, 22H), 2.68 (m, 4H), 1.83 (t, J=8.5 Hz, 4H), 1.43 (t, J=8.5 Hz, 4H). HRMS C$_{38}$H$_{34}$N$_2$S$_2$Si$_2$Cl$_6$ (rel. intensity): m/z Calcd.: 853.9739, 851.9769, 849.9798; Found: 853.9734 (53.7), 851.9752 (93.5), 849.9779 (100).

Example 7

TPDSi$_2$:TFB Film Deposition. TPDSi$_2$ and TFB were stored in sealed flasks in a N$_2$-filled glove box as 10 mg/mL solutions, each in either dry toluene or dry CB. TPDSi$_2$+TFB solutions in the same solvent were combined in a 1:1 ratio and diluted to yield a solution of about 3 mg/mL of each component. To spin-coat films in the glove box, this solution was passed through a 0.22 gm Teflon syringe filter onto cleaned ITO substrates, which were spun at 2000 rpm for 45 s. The films were then exposed to air for about 5 min to promote hydrolysis/crosslinking of the trichlorosilane groups. The resultant about 10 nm films were subsequently annealed on a hot plate in the glove box at 70° C. for 1 h prior to active layer deposition.

Example 8

PABTSi$_2$:TFB Film Deposition. PABTSi$_2$ was stored as a 10 mg/mL solution in a N$_2$-filled glove box in either dry toluene or dry CB. For OPV fabrication, PABTSi$_2$ and TFB solutions in the same solvent were combined in the glove box. To spin-coat films in the glove box, the PABTSi$_2$+TFB solution was passed through a 0.22 μm Teflon syringe filter onto cleaned ITO substrates. The films were then exposed to air for about 5 min to promote hydrolysis/crosslinking of the trichlorosilane groups. The resultant films were subsequently annealed on a hot plate in the glove box at 70° C. for 1 h prior to active layer deposition. The solvent, solution concentration, ratio of components, spin-coating parameters, and annealing conditions were varied to obtain optimum OPV performance. Optimal device performance achieved by spin-casting PABTSi$_2$:TFB (1:2) from a solution that was approximately 1.68 mM in PABTSi$_2$ at 2000 rpm for 45 s.

Example 9

Organic Field-Effect Transistor (OFET) Fabrication. Top-contact (staggered) OFETs were fabricated utilizing a about 20-30 nm PABTSi$_2$:TFB film derived from a 1:2 PABTSi$_2$:TFB solution in CB as the semiconducting layer. This layer was deposited via spin-coating in a glove box onto an n$^+$-Si/SiO$_2$ substrate (gate electrode) having a hexamethyldisilazane (HMDS)-treated SiO$_2$ dielectric layer. After exposure to ambient and annealing to ensure PABTSi$_2$ crosslinking, Au source and drain electrodes were vapor-deposited to create OFET devices with channel length (L) and width (W) of 100 and 1000 μm, respectively.

Example 10

OPV Fabrication. Detailed descriptions of P3HT:PCBM (18) and MDMO-PPV:PCBM (25) device fabrication procedures can be found elsewhere. In brief, UV ozone-cleaned patterned ITO substrates were coated with the appropriate IFL, and then either a P3HT:PCBM (1:1 by weight, about 220 nm) or an MDMO-PPV:PCBM (1:4 by weight, about 100 nm) active layer was spin-coated on top (60 s at 550 rpm or 45 s at 1500 rpm, respectively) in the glove box and then annealed. If no IFL was to be used in the P3HT:PCBM devices, the ITO was treated with dilute HCl solution prior to UVO treatment to increase the work function to 5.0 eV and enhance performance (77). LiF/Al cathodes were sequentially deposited by thermal evaporation through a shadow mask without breaking vacuum to yield four devices per substrate, each with an active area of about 0.060±0.004 cm2. The completed devices were encapsulated in the glove box and tested in ambient as described elsewhere (18, 25).

Example 11

Computational Methodology. Equilibrium geometry optimizations using density functional theory (DFT) with a B3LPY functional and the 6-31G* basis set were performed using QChem 2.1 (78). Single-point calculations using these optimized geometries were performed at the DFT/B3LPY/6-31G* level of theory to obtain molecular orbital energies (QChem). Energy levels were adjusted to experimentally obtained electrochemical values for $TPDSi_2$ HOMO and LUMO energies (see discussion below).

Example 12

PABTSi2 Design. This EXAMPLE and following EXAMPLES first describes the design, synthesis and characterization of $PABTSi_2$ as well as the morphological, optical, and electrochemical characteristics of $PABTSi_2$-based films, according to various exemplary embodiments of the present invention. The consequences of implementing $PABTSi_2$:TFB-based IFLs in two well-characterized donor polymer: PCBM BHJ systems, using MDMO-PPV and P3HT (3, 14, 17, 22), is then presented. It will be seen that the $PABTSi_2$-derived IFL, having a HOMO well-aligned energetically with that of P3HT, functions as an efficient HTL/EBL when paired with a P3HT:PCBM active layer, but not with an MDMO-PPV:PCBM active layer. These disparities are primarily attributed to differences in energy level matching and underscore the significance of tailoring IFL electronic properties to those of the associated OPV active material.

Using geometries optimized at the DFT/B3LYP/3-21G* level, HOMO and LUMO energy calculations targeted $TPDSi_2$ modifications required to raise the HOMO energy to better match that of P3HT while maintaining a sufficiently high LUMO to block misdirected electrons as an anode IFL. Appending alkoxy electron-donors to the TPD phenyl para position is known to raise the HOMO only slightly (79). In contrast, bithiophene fragments are significantly more electron-rich, leading to higher-lying HOMOs (71, 80, 81). The present B3LYP/6-31G* level calculations predict $PABTSi_2$ HOMO and LUMO energies of 4.9 and 1.7 eV, respectively, versus 5.3 and 2.3 eV for $TPDSi_2$. These will be shown below to be in good agreement with experimental cyclic voltammetry and optical spectroscopy results. These data are also in good agreement with literature electrochemical data for similar p-type architectures without propyltrichlorosilane tethers (82). Such functionalized "tethers" are essential for $PABTSi_2$ covalent chemisorption on the ITO surface (83-85) and for forming crosslinked IFL blends in air. This renders the IFL film insoluble in standard organic solvents and thus facilitates the BHJ OPV fabrication, without significantly compromising the frontier orbital energetics.

Example 13

PABTSi2 Synthesis. Initially, a synthetic route analogous to that for $TPDSi_2$ (43) was pursued using a bithiophene rather than a biphenyl core, beginning with Buchwald-Hartwig coupling (86-91) of aniline and 5,5'-dibromo-2,2'-bithiophene. Although a variety of catalysts, ligands, and reaction conditions were investigated, negligible yields were obtained. This agrees with general findings that while 2-bromobithiophene coupling with secondary amines proceed in high yield, negligible reaction is observed with aniline (92). The successful $PABTSi_2$ synthetic pathway then adopted is that in FIG. 2(b), and details are provided in the Examples.

Example 14

$PABTSi_2$ Film Characterization. The morphological, electrochemical, and optical properties of the $PABTSi_2$-derived and $PABTSi_2$:TFB-derived films were characterized by AFM, CV, and optical spectroscopy, and the results are compared below to those for $TPDSi_2$.

Figure 11:
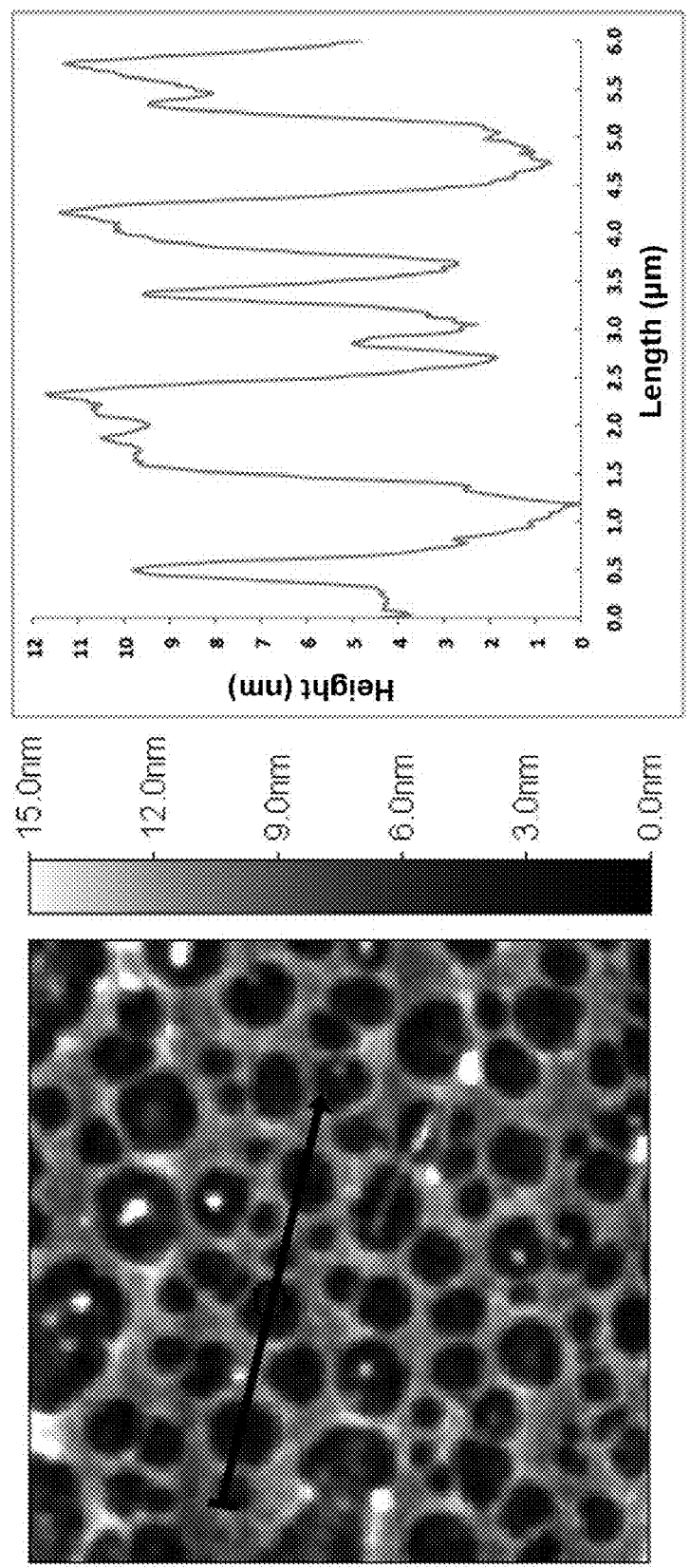
FIG. 11 shows line scan of AFM image used in FIG. 3(e) showing the surface of a 25 nm PABTSi$_2$:TFB (1:1) film annealed at 135° C. (RMS roughness=3.2 nm).
Figure 12:
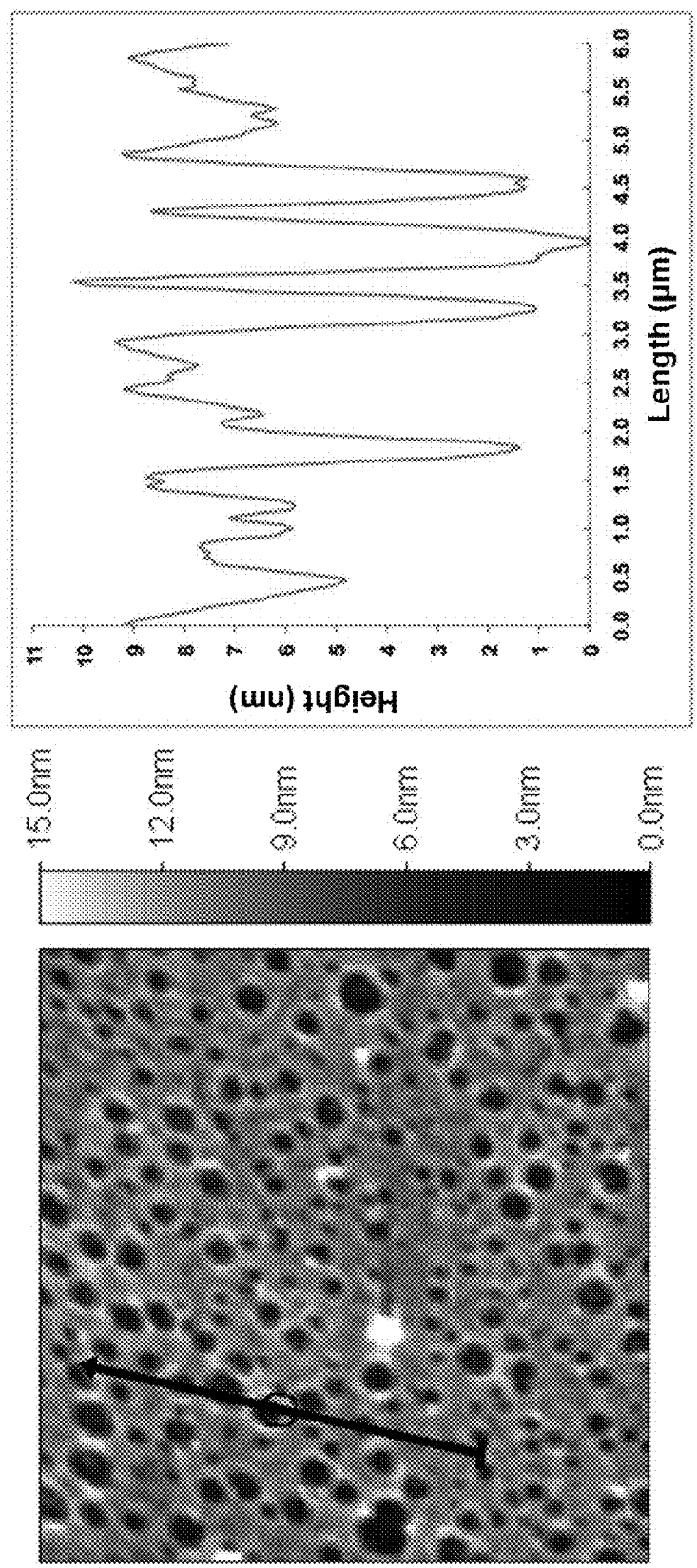
FIG. 12 shows line scan of AFM image used in FIG. 3(f) showing the surface of a 25 nm PABTSi$_2$:TFB (1:2) film annealed at 135° C. (RMS roughness=2.2 nm).

Crosslinked Film Morphology. $PABTSi_2$ and $PABTSi_2$:TFB films were spin-coated from either toluene or CB solution and thermally cured as indicated in the Experimental Section. Tapping mode AFM images of the resulting films on ITO (typical ITO RMS roughness≈1.4 nm, FIG. 3a) reveal planarization of the ITO surface on $PABTSi_2$ and $PABTSi_2$:TFB films deposition from toluene, similar to results for $TPDSi_2$ and $TPDSi_2$:TFB (42, 43, 93). FIG. 3b shows a smooth (RMS roughness=0.7 nm), crosslinked, unannealed $PABTSi_2$ film cast from toluene, while FIG. 3c demonstrates that incorporating an equal amount of TFB yields even smoother crosslinked films (RMS roughness=0.5 nm). Annealing the films at various temperatures in a $N_2$ glove box for 1 h produced no significant change in $PABTSi_2$:TFB morphology, as exemplified by the specimen in FIG. 3d (RMS roughness=0.6 nm), which was annealed at 135° C. Note that if CB is used as the spin-casting solvent, $PABTSi_2$:TFB films exhibit rougher surfaces (RMS roughness=3.2 nm) with obvious phase separation features of about 0.5-1.0 μm (FIG. 3e). In CB-cast films, changing the component ratio to 1:2 $PABTSi_2$:TFB yields smoother, more homogeneous films than does the 1:1 ratio, now affording phase separation features of about 300-500 nm with RMS roughness=2.2 nm (FIG. 3f). Line scans of FIGS. 3e-f, which are shown in FIG. 11 and FIG. 12, respectively, determine the height variation between the different phases to be about 10 nm, which is less than half of the thickness of the 25 nm films, indicating the film achieves complete ITO coverage. OPV fabrication experiments indicated that CB solutions are required for the P3HT:PCBM active layers to completely wet the IFL surface, and that annealed 1:2 $PABTSi_2$:TFB films from CB (FIG. 3f) afford the highest-performing P3HT:PCBM OPVs (see below).

Figure 4:
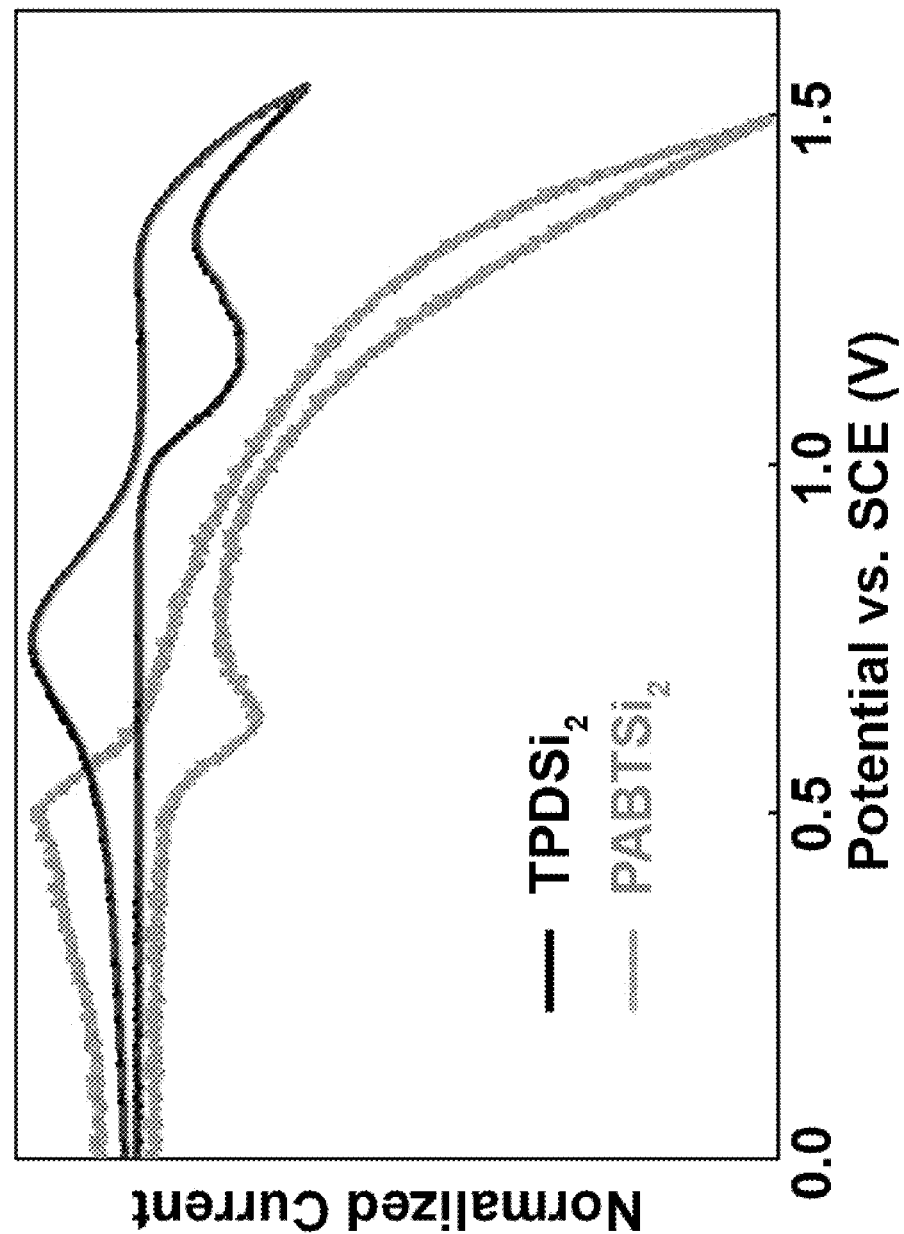
FIG. 4 shows Cyclic voltammograms of TPDSi$_2$ and PABTSi$_2$ drop-cast films on a platinum electrode in acetonitrile with 0.1 M Bu$_4$N$^+$ PF$_6^-$ as the electrolyte. Scan rates are 100 mV/s according to one embodiment of the present invention.

Comparative Electrochemical Properties of $PABTSi_2$— and $TPDSi_2$—Based Films. The electrochemical response of $PABTSi_2$- and $TPDSi_2$-derived films was investigated via cyclic voltammetry (FIG. 4). The onset of $TPDSi_2$ oxidation is 0.94 V (versus SCE), and the separation of the reversible half-wave energies (ΔE) is quite large (about 400 mV). $PABTSi_2$ exhibits the onset of oxidation around 0.50 V, also with a large separation of forward and reverse peaks (about 150 mV). It is evident that the bithiophene core affords a more electron-rich IFL and raises the HOMO level closer to vacuum for closer alignment with the P3HT HOMO. The $TPDSi_2$ and $PABTSi_2$ HOMO energies as determined electrochemically are 5.3 and 4.9 eV, respectively, and are shown in relation to the MDMO-PPV and P3HT HOMO energies in FIG. 2. Since the P3HT HOMO is about 5.0 eV, $PABTSi_2$ has excellent energy-level alignment to accept holes from this BHJ polymer en route to collection at the ITO anode. It will be shown below that films produced by blending $PABTSi_2$ with TFB are p-type semiconductors with substantial FET hole mobility. In contrast, $TPDSi_2$-derived films are expected to be less efficient in hole collection from the P3HT due to the deeper-lying HOMO and, when blended with TFB, exhibit somewhat lower FET hole mobility.

Additional information is gleaned from the electrochemistry by noting that the expected 59 mV ΔE values for Nernstian reactions in solution, and for rapid reversible electron transfer, are not observed here (94). Larger half-wave spacings typical of some surface-anchored species and observed for the TPDSi$_2$- —and PABTSi$_2$—based films can be attributed to densely-crosslinked films in which redox processes are kinetically hindered, likely via impeded counteranion mobility through the dense matrices (69, 85, 94).

Figure 5:
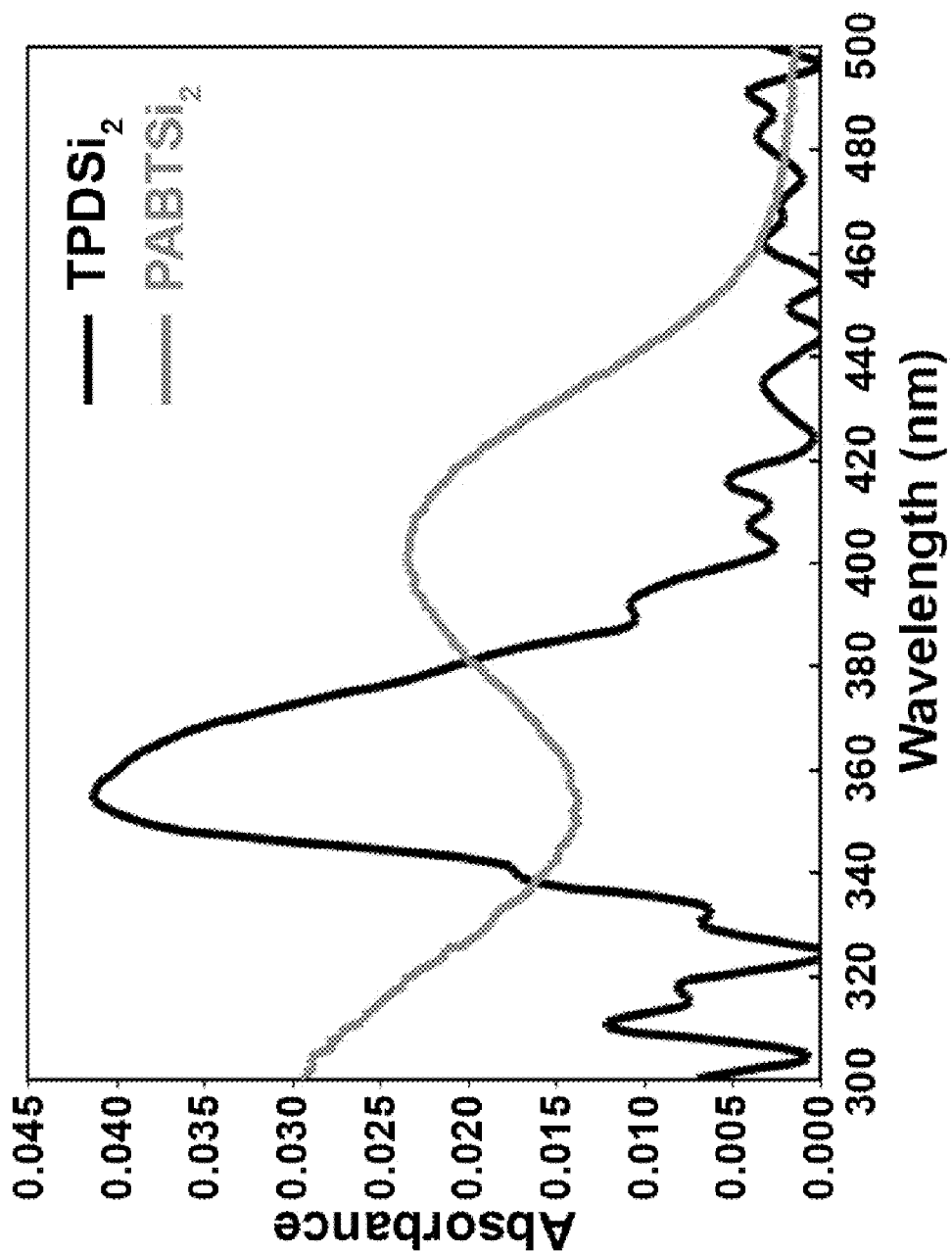
FIG. 5 shows Optical absorption characteristics of spin-cast films of PABTSi$_2$ (about 20 nm) and TPDSi$_2$ (about 10 nm) on glass substrates according to various embodiments of the present invention.
Figure 6:
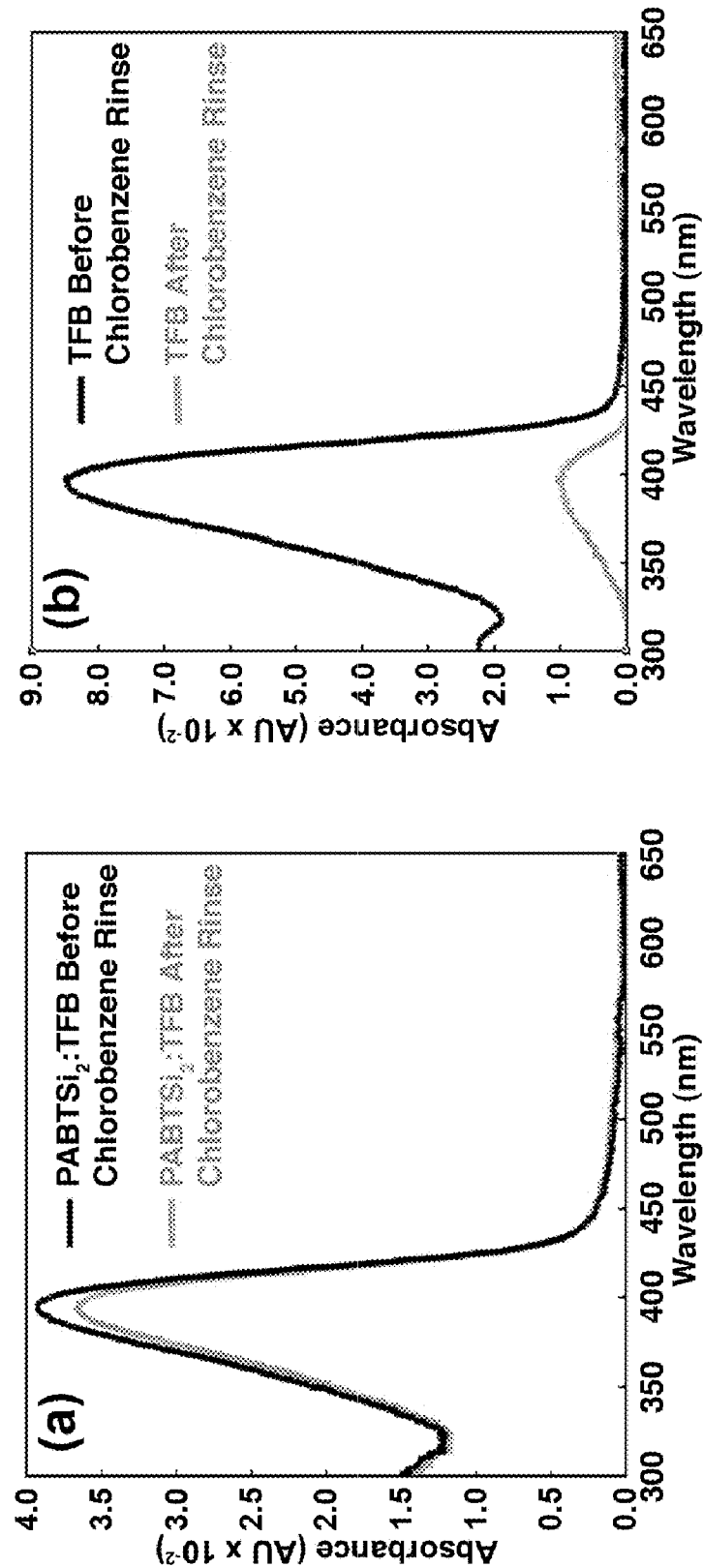
FIG. 6 shows transmission optical spectra demonstrate that (a) about 10 nm PABTSi$_2$:TFB-based films are insoluble in CB and that (b) about 20 nm pure TFB films are readily dissolved by CB according to various embodiments of the present invention.

Optical Spectroscopy of PABTSi$_2$- and TPDSi$_2$-Derived Films. An important OPV IFL requirement is optical transparency to ensure that the maximum photon flux reaches the active layer. FIG. 5 illustrates that both PABTSi$_2$- and TPDSi$_2$-derived films exhibit good optical transparency in the visible region, with maximum absorption peaks ($\lambda_{max}$) at 401 and 355 nm, respectively. Importantly, neither cross-section interferes significantly with the P3HT ($\lambda_{max}$=493-517 nm, shoulder at 572 nm) or MDMO-PPV ($\lambda_{max}$=500 nm) film absorption (95, 96). Additionally, the solar spectral region with the largest photon flux is in wavelengths equal or longer than that absorbed by the present active layer materials, and a relatively small percentage of solar photons (about 15%) is even of proper energy for IFL absorption (4). Moreover, the IFLs applied to the present OPV devices are only about 10-25 nm in thickness, so that the absorbance of the TPDSi$_2$- and PABTSi$_2$-derived films at $\lambda_{max}$ is only about 0.02-0.04 absorbance units, corresponding to 91-95% transmission at $\lambda_{max}$. The LUMO energies for PABTSi$_2$ and TPDSi$_2$, estimated from the optical band gap, as determined from the onset of absorption and the CV-derived HOMO values, are 2.2 and 2.3 eV, respectively.

Solubility of PABTSi$_2$:TFB-Derived IFLs. Optical spectra of a blended, spin-cast, crosslinked PABTSi$_2$:TFB film before and after soaking in CB for about 1 min (FIG. 6(a)) demonstrate that the present film deposition process embeds the TFB within a crosslinked PABTSi$_2$ matrix, rendering both film components insoluble in common organic solvents. This insolubility demonstrated by crosslinked PABTSi$_2$ and TPDSi$_2$ (15, 42), is pivotal in utilizing these as IFLs, since the successive spin-coating procedures required in BHJ device fabrication necessitate that deposition of one layer not dissolve the previous. In the past, this was achieved using orthogonal solvents, such as for aqueous PEDOT:PSS suspensions. In contrast to crosslinked PABTSi$_2$:TFB, neat TFB films dissolve readily on exposure to CB for only several seconds, as shown in FIG. 6(b).

Example 15

IFL Transport Properties. Maintaining sufficient and balanced BHJ hole and electron mobilities is important to prevent space-charge from building up and eroding OPV power conversion efficiency (3, 97). It is similarly important that an anode-side IFL, such as the present PABTSi2:TFB-derived films, exhibit significant hole mobility to prevent charge buildup at this interface. Thus, the FET hole-mobility (μh) of PABTSi2:TFB films was measured and compared to parallel results for TPDSi2:TFB (98). Top-contact OFET devices (98) were fabricated having the structure: n+-Si (gate)/SiO2-HMDS (300 nm)/PABTSi2:TFB film (20-30 nm)/Au source-drain (50 nm) with L=100 μm and W=1000 μm. The hole mobility of PABTSi2:TFB was determined to be 1.1×10−3 cm2/V s, the current on-off ratio (Ion:Ioff) about 10$^5$, and the threshold voltage (VT), −14 V. These metrics are comparable to, or slightly better than those for TPDSi2:TFB and TFB alone (Table 1).

TABLE 1

OFET performance of semiconductors PABTSi$_2$:TFB, TPDSi$_2$:TFB, and TFB in a (staggered) bottom-gate top-contact architecture.

| Semiconductor | $\mu_h{}^a$ | $I_{on}$:$I_{off}$ | $V_T{}^b$ |
|---|---|---|---|
| PABTSi$_2$:TFB | $1.1 \times 10^{-3}$ | $10^5$ | −14 |
| TPDSi$_2$:TFB$^c$ | $5 \times 10^{-4}$ | $10^4$ | −15 |
| TFB$^c$ | $8 \times 10^{-4}$ | $10^5$ | −30 |

$^a$Units of cm$^2$/V s.
$^b$Units of V.
$^c$Data from Ref. (98).

Example 16

Figure 7:
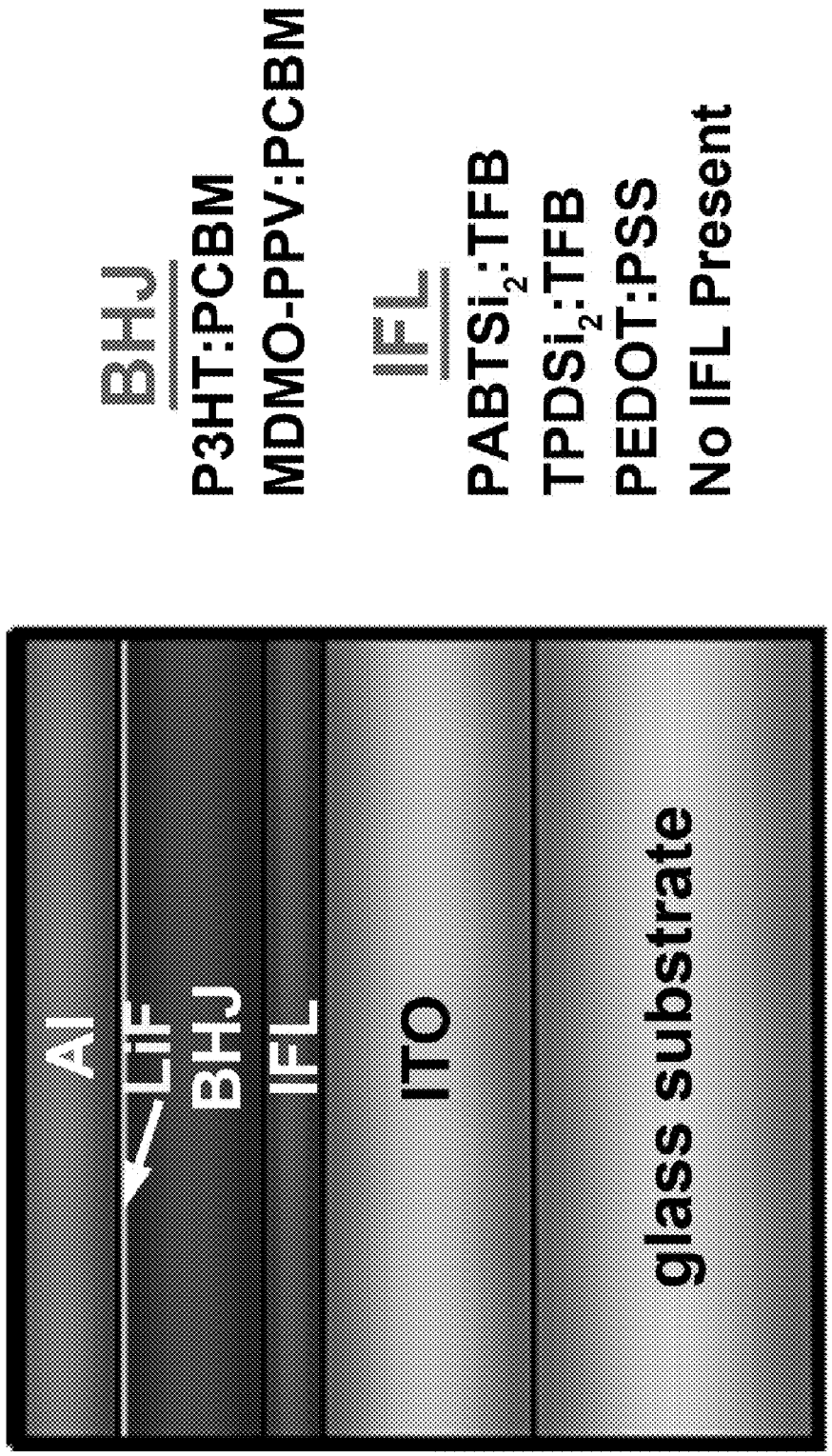
FIG. 7 shows an OPV device architecture with a P3HT:PCBM or MDMO-PPV:PCBM BHJ active layer and a PABTSi$_2$:TFB, TPDSi$_2$:TFB, or PEDOT:PSS IFL (99) according to one embodiment of the present invention.
Figure 8:
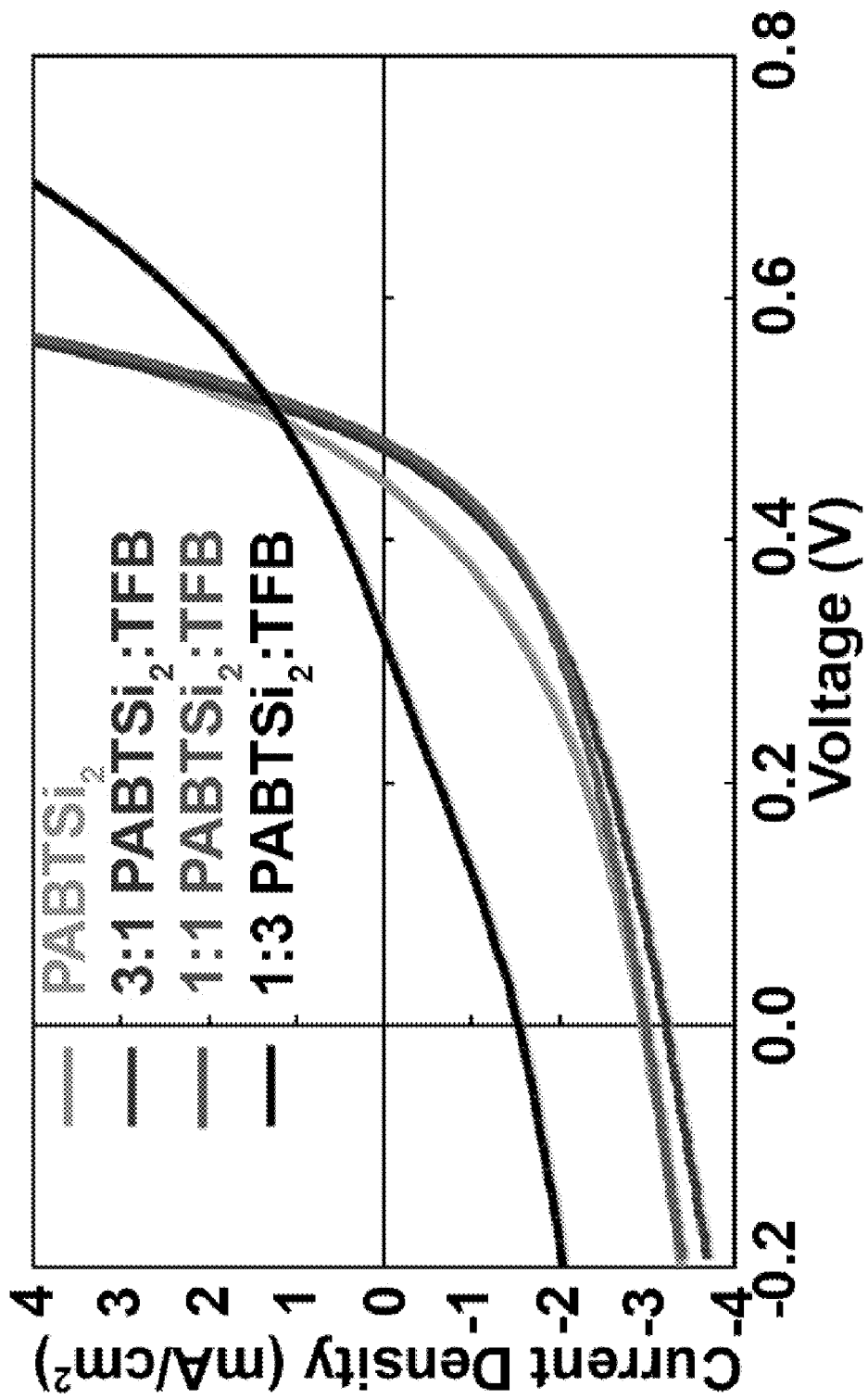
FIG. 8 shows J-V plots for BHJ OPVs having MDMO-PPV:PCBM active layers with various ratios of the PABTSi$_2$:TFB IFL components. Data plotted are for individual representative devices with typical performance metrics for their respective architectures and materials composition according to various embodiments of the present invention.
Figure 9:
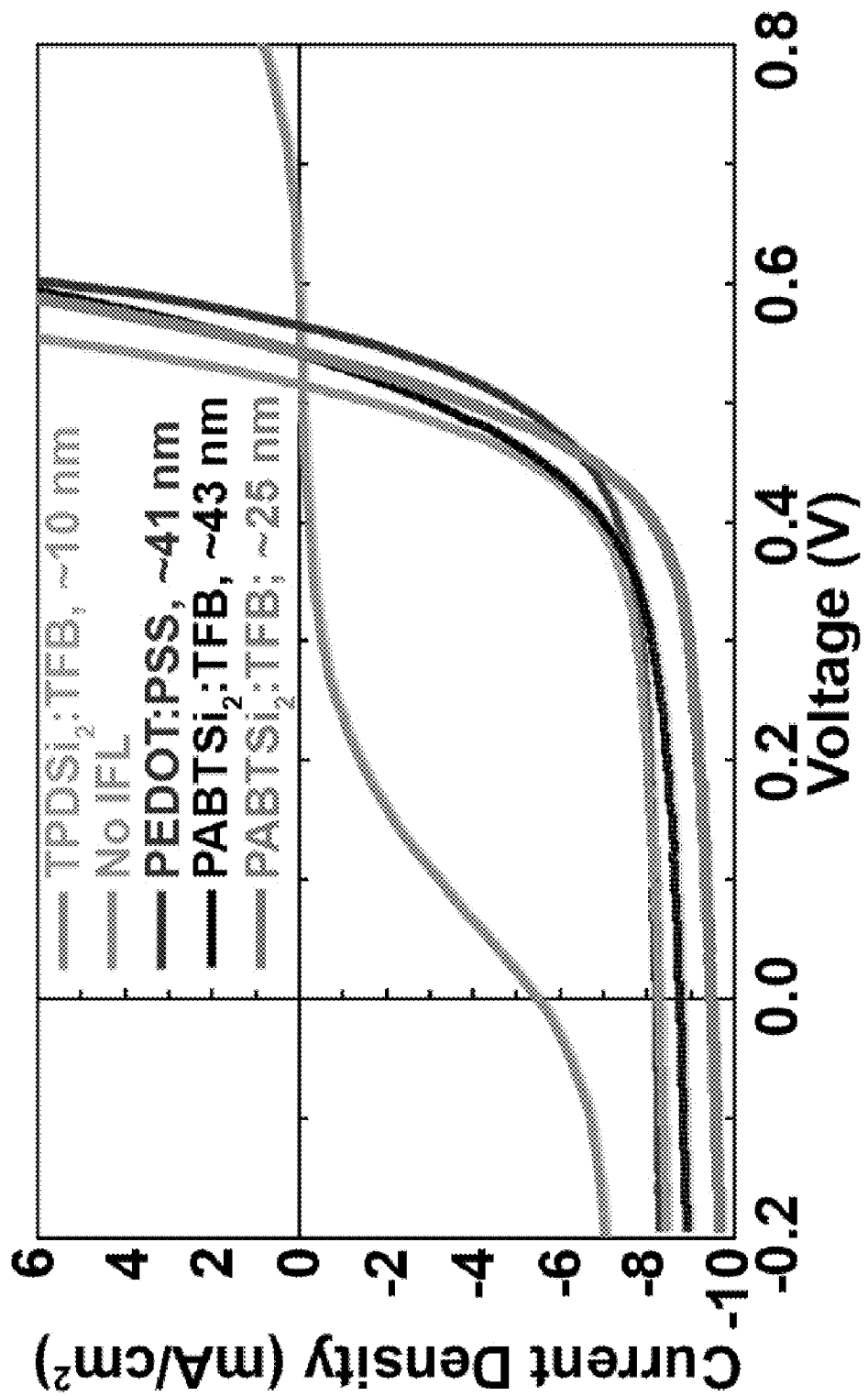
FIG. 9 shows J-V plots for BHJ OPVs having a P3HT:PCBM active layer fabricated with the indicated IFLs, including various IFL PABTSi$_2$:TFB (1:2) IFL thicknesses. Data plotted are for individual representative devices with typical performance metrics for their respective architectures and materials composition according to various embodiments of the present invention.
Figure 10:
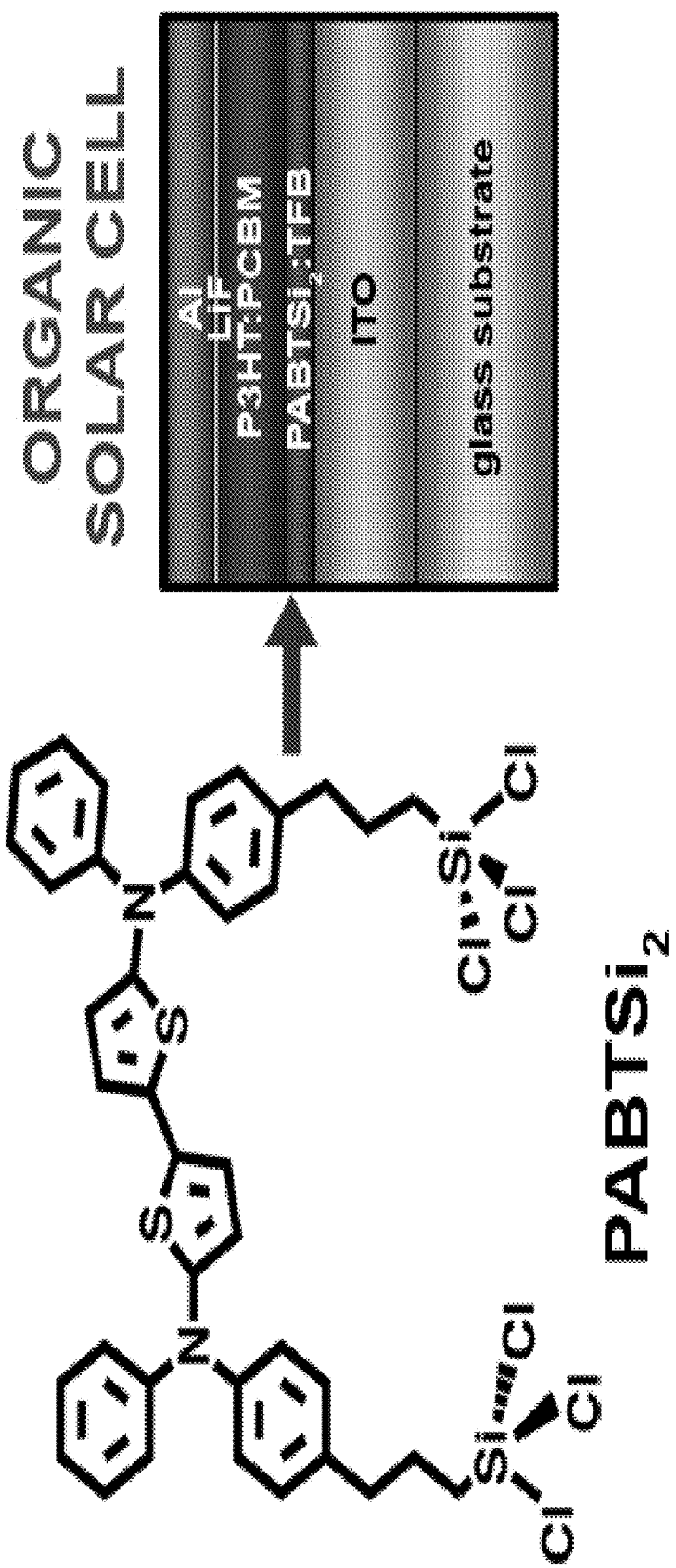
FIG. 10 shows an organic solar cell according to one embodiment of the present invention.

OPV Device Performance Using PABTSi$_2$:TFB as an IFL. BHJ OPV devices containing P3HT:PCBM and MDMO-PPV:PCBM active layers and utilizing PABTSi$_2$:TFB, TPDSi$_2$:TFB, and PEDOT:PSS IFLs between the ITO and the BHJ layer were fabricated as shown in FIG. 7. FIGS. 8 and 9 show current density-voltage (J-V) plots for these cells, and data are summarized in Tables 2 and 3, respectively.

Example 17

PABTSi$_2$ IFLs in MDMO-PPV:PCBM OPVs. OPVs with MDMO-PPV as the donor polymer were previously shown to exhibit enhanced V$_{oc}$ and η$_p$ metrics if a thin about 10 nm film of TPDSi$_2$:TFB film is used as the IFL rather than conventional PEDOT:PSS (15, 25). The MDMO-PPV HOMO level (5.3 eV) aligns well with that of TPDSi$_2$ (FIG. 2), a priori, there should be little energetic barrier for hole transfer to the IFL and subsequent extraction by the ITO anode. Since TPDSi$_2$:TFB forms thermally robust, crosslinked films and OPVs having superior device performance versus those fabricated with PEDOT:PSS, TPDSi$_2$:TFB effectively replaces PEDOT:PSS in MDMO-PPV OPVs (15, 25). Substituting PABTSi$_2$ for TPDSi$_2$ while maintaining a constant active layer, however, does not afford significant performance improvement.

ITO/PABTSi$_2$:TFB/MDMO-PPV:PCBM/LiF/Al devices exhibit low V$_{oc}$ values, similar to OPVs with no IFL (See FIG. 8, and Table 2). The origin of the low V$_{oc}$ is likely non-Ohmic contact with the active layer. Mihailetchi et al. showed that for BHJ OPVs with non-Ohmic contacts, V$_{oc}$ is predominately determined by the anode-cathode work function differential instead of the donor HOMO-acceptor LUMO separation (3, 100). The PABTSi$_2$ HOMO is not well-aligned with that of MDMO-PPV (about 0.4 eV difference; FIG. 2), and the measured V$_{oc}$ in PABTSi$_2$ cells is about 0.47 V. Note that this value is identical to the V$_{oc}$ of ITO/MDMO-PPV:PCBM/LiF/Al devices having no anode IFL, which doubtless form a non-Ohmic anode-side contact due to the large MDMO-PPV HOMO (5.3 eV) and ITO work function (4.7 eV) energetic disparity. Additionally, the approximate work function differential of the ITO and Al electrodes (ΔΦ=Φ$_{ITO}$−Φ$_{Al}$=4.7 eV-4.2 eV=0.5 eV), which should dictate V$_{oc}$ in a device with a non-Ohmic contact, and agrees well with the observed V$_{oc}$. These results all strongly suggest that a non-Ohmic contact is present at the MDMO-PPV OPV anode. Furthermore, cells using various PABTSi$_2$:TFB ratios of uniform film thickness (about 12 nm) yield OPVs with essentially invariant V$_{oc}$ values of about 0.47 V (See FIG. 8). As the ratio approaches 1:3 PABTSi$_2$:TFB, the measured series resistance (R$_S$) increases significantly, evident from the decreased J-V plot slope near the x-axis intercept (FIG. 8) and greatly reduced FF (6, 7, 101, 102). This result suggests that when there is insufficient silane to completely embed the TFB in a crosslinked matrix, a less dense IFL and an irregular interface results.

TABLE 2

Average response parameters and standard deviations (σ) for several (typically four) ITO/PABTSi$_2$:TFB/MDMO-PPV:PCBM/LiF/Al OPV devices made in parallel having the PABTSi$_2$:TFB ratios indicated.

| | PABTSi$_2$:TFB Ratio (σ) | | | | |
|---|---|---|---|---|---|
| | 0:0, No IFL | 1:0 | 3:1 | 1:1 | 1:3 |
| $V_{oc}$ (V) | 0.47 | 0.43 | 0.47 | 0.48 | 0.28 |
| | (0.04) | (0.02) | (0.01) | (0.004) | (0.02) |
| $J_{sc}$ (mA/cm$^2$) | 3.64 | 2.78 | 3.11 | 2.99 | 1.27 |
| | (0.17) | (0.27) | (0.16) | (0.12) | (0.18) |
| FF (%) | 40.8 | 36.7 | 40.8 | 42.0 | 27.7 |
| | (0.5) | (1.7) | (1.2) | (0.7) | (1.7) |
| $\eta_p$ (%) | 0.71 | 0.40 | 0.60 | 0.60 | 0.10 |
| | (0.10) | (0.06) | (0.02) | (0.03) | (0.02) |

Example 18

PABTSi$_2$ IFLs in P3HT:PCBM OPVs. The question next arises as to whether MDMO-PPV:PCBM active layers, known to have nanocrystalline PCBM domains and amorphous MDMO-PPV regions (103), interact differently than do P3HT:PCBM active layers with more ordered constituents (103, 104). In addition to the crystallinity variations, the two active layers of course have greatly different morphologies and donor orbital energetics, which should impart different interfacial and transport characteristics (105, 106). Such experiments require separate IFL optimization for each active layer. For TPDSi$_2$:TFB and PABTSi$_2$:TFB in MDMO-PPV:PCBM OPVs, the optimum solvent used for spin-coating the IFL components is found to be toluene, as discussed above. Smooth films are obtained in this way as assessed by AFM, and MDMO-PPV:PCBM active layer films cast from CB are also smooth. However, P3HT:PCBM active layers are typically spin-coated from more polar ODCB. In this work it was found that ODCB-cast P3HT:PCBM layers dewet during the slow-drying process if deposited on toluene-cast IFLs, leaving only discontinuous BHJ areas on the substrate. Thus, the IFL components were deposited from CB solutions, a solvent more compatible with ODCB and which significantly improves the IFL wetting by the P3HT:PCBM solutions, affording contiguous films.

The BHJ spin-casting solvent is known to have a significant impact on resultant film morphologies, as demonstrated previously for MDMO-PPV:PCBM active layers deposited from toluene and CB (14). Toluene-cast films afford rougher surfaces with large horizontal areas of phase segregation and yield lower-performing MDMO-PPV:PCBM OPVs than smoother CB-cast films which exhibit more uniform constituent mixing. This characteristic allowed Shaheen et al. to increase the MDMO-PPV:PCBM OPV $\eta_p$ from 0.9% to 2.5% by processing from toluene rather than CB (14). Similarly, the present PABTSi$_2$:TFB IFL morphologies for films cast from toluene versus CB are quite different, as illustrated in FIGS. 3(d)-(f). Moreover, FIG. 11 shows line scan of AFM image used in FIG. 3(e) showing the surface of a 25 nm PABTSi$_2$:TFB (1:1) film annealed at 135° C. (RMS roughness=3.2 nm), and FIG. 12 shows line scan of AFM image used in FIG. 3(f) showing the surface of a 25 nm PABTSi$_2$:TFB (1:2) film annealed at 135° C. (RMS roughness=2.2 nm). CB affords rougher, more phase-segregated films than toluene, with apparent PABTSi$_2$ domain sizes of about 0.5-1 μm for a 1:1 PABTSi$_2$:TFB ratio, and about 300-500 nm for a 1:2 ratio. Experimentation determined that a 1:2 ratio from CB affords optimum P3HT:PCBM BHJ OPV performance.

After optimizing the spin-coating solvent and IFL component ratio, the PABTSi$_2$:TFB film thicknesses were varied in P3HT:PCBM OPV fabrication. Not unexpectedly, increasing the thickness increases the overall OPV $R_S$ (107, 108), determined from the inverse of the J-V curve slope at the x-axis intercept and by the FF (6, 7, 101, 102). FIG. 9 compares J-V plots of several PABTSi$_2$:TFB film thicknesses to those of P3HT:PCBM devices using PEDOT:PSS and TPDSi$_2$:TFB as IFLs, and also to a device having no IFL. All OPVs were fabricated in parallel, and it is evident that the PABTSi$_2$:TFB produces OPV metrics rivaling optimized PEDOT:PSS devices. Response parameters from FIG. 9 are compiled in Table 3. In the case of P3HT:PCBM OPVs with no IFL, a $V_{oc}$ of 0.47 V is not observed as for MDMO-PPV:PCBM devices with no IFL. The observed $V_{oc}$ values for this P3HT:PCBM cell are only slightly less than devices which employ an IFL, implying that the anode contact for P3HT:PCBM OPVs without an IFL is still largely Ohmic, and $V_{oc}$ is still determined predominantly by the HOMO-LUMO gap. This is likely attributable to the dilute HCl solution treatment that is known to optimize IFL-free P3HT:PCBM device performance (77).

Note here that P3HT:PCBM devices fabricated with TPDSi$_2$:TFB IFLs perform marginally, using any deposition solvent, component ratio, or thickness investigated. Results for the optimized TPDSi$_2$:TFB/P3HT:PCBM devices are shown in FIG. 9. This marginal TPDSi$_2$:TFB performance may be attributed, as discussed above, to the large TPDSi$_2$ and P3HT HOMO energy mismatch, which creates a barrier to hole transport to, and collection at, the anode. This result also validates the rationale underlying the design and implementation of PABTSi$_2$-based IFLs for P3HT:PCBM BHJ OPVs as an effective crosslinking, hole-transporting bithiophene semiconductor with a HOMO energy closely aligned with that of P3HT.

TABLE 3

Average response parameters and standard deviations (σ) for several (typically four) ITO/IFL/P3HT:PCBM/LiF/Al OPV devices having the indicated IFLs, IFL ratios, and IFL thicknesses.

| | IFL Used Ratio, Thickness (σ) | | | | |
|---|---|---|---|---|---|
| | PABTSi$_2$:TFB 1:2, 25 nm | PABTSi$_2$:TFB 1:2, 43 nm | PEDOT:PSS 1:6, 41 nm | No IFL 0:0, 0 nm | TPDSi$_2$:TFB 1:1, 10 nm |
| $V_{oc}$ (V) | 0.54 | 0.54 | 0.56 | 0.52 | 0.55 |
| | (0.003) | (0.001) | (0.001) | (0.005) | (0.04) |
| $J_{sc}$ (mA/cm$^2$) | 9.31 | 8.40 | 8.57 | 8.04 | 4.72 |
| | (0.17) | (0.23) | (0.47) | (0.19) | (0.50) |

TABLE 3-continued

Average response parameters and standard deviations (σ) for several (typically four) ITO/IFL/P3HT:PCBM/LiF/Al OPV devices having the indicated IFLs, IFL ratios, and IFL thicknesses.

| | IFL Used Ratio, Thickness (σ) | | | | |
|---|---|---|---|---|---|
| | PABTSi$_2$:TFB 1:2, 25 nm | PABTSi$_2$:TFB 1:2, 43 nm | PEDOT:PSS 1:6, 41 nm | No IFL 0:0, 0 nm | TPDSi$_2$:TFB 1:1, 10 nm |
| FF (%) | 62.7 (0.5) | 59.3 (0.28) | 65.1 (0.31) | 64.4 (0.18) | 10.4 (0.58) |
| η$_p$ (%) | 3.14 (0.08) | 2.68 (0.08) | 3.14 (0.17) | 2.69 (0.03) | 0.28 (0.04) |

Example 19

OPV Device Performance Using PABTSi$_2$:TFB as an IFL. BHJ OPV devices containing P3HT:PCBM and MDMO-PPV:PCBM active layers and utilizing PABTSi$_2$:TFB, TPDSi$_2$:TFB, and PEDOT:PSS IFLs between the ITO and the BHJ layer were fabricated as shown in FIG. 7. FIGS. 8 and 9 show current density-voltage (J-V) plots for these cells, and data are summarized in Tables 2 and 3.

Example 20

OPV Device Performance Using PABTSi$_2$:TFB as an IFL. BHJ OPV devices containing P3HT:PCBM and MDMO-PPV:PCBM active layers and utilizing PABTSi$_2$:TFB, TPDSi$_2$:TFB, and PEDOT:PSS IFLs between the ITO and the BHJ layer were fabricated as shown in FIG. 7. FIGS. 8 and 9 show current density-voltage (J-V) plots for these cells, and data are summarized in Tables 2 and 3.

Accordingly, among other things, the present invention provides synthesis, characterization, and implementation of an energetically tuned IFL precursor, PABTSi$_2$, as a component in P3HT:PCBM BHJ OPVs in various embodiments. Theory-aided design introduces a more electron-rich bithiophene which effectively raises the HOMO energy to minimize the energy barrier for hole transfer between the PABTSi$_2$ IFL (4.9 eV) and P3HT (5.0 eV) while blocking misdirected electrons. Characterization data indicate that the PABTSi$_2$ HOMO (4.9 eV) is tailored perfectly for P3HT:PCBM-based OPVs, similar to TPDSi$_2$ IFLs for MDMO-PPV:PCBM-based OPVs. The robust, crosslinked PABTSi$_2$:TFB IFL strongly binds to the hydroxylated ITO surface, was incorporated into P3HT:PCBM OPVs, and affords optimized devices with solar power conversion efficiencies comparable to those of heavily optimized PEDOT:PSS-based devices.

Other existing techniques such as TEM, SEM, STM, and XRD may also be utililzed to further characterize the devices made according to various embodiments of the present invention.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES (1) Dennler, G.; Scharber, M. C.; Brabec, C. J. *Adv. Mater.* 2009, 21, 1.
(2) Jørgensen, M.; Norman, K.; Krebs, F. C. *Sol. Energy Mater. Sol. Cells* 2008, 92, 686.
(3) Blom, P. W. M.; Mihailetchi, V. D.; Koster, L. J. A.; Markov, D. E. *Adv. Mater.* 2007, 19, 1551.
(4) Bundgaard, E.; Krebs, F. C. *Sol. Energy Mater. Sol. Cells* 2007, 91, 954.
(5) Günes, S.; Neugebauer, H.; Sariciftci, N. S. *Chem. Rev.* 2007, 107, 1324.
(6) Rand, B. P.; Genoe, J.; Heremans, P.; Poortmans, J. *Prog. Photovolt. Res. Appl.* 2007, 15, 659.
(7) Moliton, A.; Nunzi, J.-M. *Polym. Int.* 2006, 55, 583.
(8) Gledhill, S. E.; Scott, B.; Gregg, B. A. *J. Mater. Res.* 2005, 20, 3167.
(9) Sun, S.-S.; Sariciftci, N. S., *Organic Photovoltaics: Mechanisms, Materials, and Devices*. CRC: Boca Raton, Fla., 2005.
(10) Tang, C. W. *Appl. Phys. Lett.* 1986, 48, 183.
(11) Halls, J. J. M.; Walsh, C. A.; Greenham, N. C.; Marseglia, E. A.; Friend, R. H.; Moratti, S. C.; Holmes, A. B. *Nature* 1995, 376, 498.
(12) Yu, G.; Gao, J.; Hummelen, J. C.; Wudl, F.; Heeger, A. J. *Science* 1995, 270, 1789.
(13) Yu, G.; Heeger, A. J. *J. Appl. Phys.* 1995, 78, 4510.
(14) Shaheen, S. E.; Brabec, C. J.; Sariciftci, N. S.; Padinger, F.; Fromherz, T.; Hummelen, J. C. *Appl. Phys. Lett.* 2001, 78, 841.
(15) Hains, A. W.; Marks, T. J. *Appl. Phys. Lett.* 2008, 92, 023504.
(16) Li, G.; Shrotriya, V.; Huang, J.; Yao, Y.; Moriarty, T.; Emery, K.; Yang, Y. *Nat. Mater.* 2005, 4, 864.
(17) Ma, W.; Yang, C.; Gong, X.; Kwanghee, L.; Heeger, A. *Adv. Funct. Mater.* 2005, 15, 1617.
(18) Irwin, M. D.; Buchholz, D. B.; Hains, A. W.; Chang, R. P. H.; Marks, T. J. *Proc. Natl. Acad. Sci. U.S.A.* 2008, 105, 2783.
(19) Green, M. A.; Emery, K.; Hishikawa, Y.; Warta, W. *Prog. Photovolt. Res. Appl.* 2009, 17, 85.
(20) Koster, L. J. A.; Mihailetchi, V. D.; Blom, P. W. M. *Appl. Phys. Lett.* 2006, 88, 093511.
(21) Rand, B. P.; Burk, D. P.; Forrest, S. R. *Phys. Rev. B: Condens. Matter* 2007, 75, 115327.
(22) Dennler, G.; Scharber, M. C.; Ameri, T.; Denk, P.; Forberich, K.; Waldauf, C.; Brabec, C. J. *Adv. Mater.* 2008, 20, 579.

(23) Scharber, M. C.; Mühlbacher, D.; Koppe, M.; Denk, P.; Waldauf, C.; Heeger, A. J.; Brabec, C. J. *Adv. Mater.* 2006, 18, 789.
(24) Brabec, C. J.; Hauch, J. A.; Schilinsky, P.; Waldauf, C. *MRS Bull.* 2005, 30, 50.
(25) Hains, A. W.; Liu, J.; Martinson, A. B. F.; Irwin, M. D.; Marks, T. J. *Adv. Funct. Mater.* 2009, in press.
(26) Liu, A.; Zhao, S.; Rim, S.-B.; Wu, J.; Könemann, M.; Erk, P.; Peumans, P. *Adv. Mater.* 2008, 20, 1065.
(27) Gregg, B. A. *J. Phys. Chem. B* 2003, 107, 4688.
(28) Gregg, B. A. *MRS Bull.* 2005, 30, 20.
(29) Lin, Z. *Chem. Eur. J.* 2008, 14, 6494.
(30) Nanditha, D. M.; Dissanayake, M.; Hatton, R. A.; Curry, R. J.; Silva, S. R. P. *Appl. Phys. Lett.* 2007, 90, 113505.
(31) Kim, J. Y.; Lee, K.; Coates, N. E.; Moses, D.; Nguyen, T.-Q.; Dante, M.; Heeger, A. J. *Science* 2007, 317, 222.
(32) Kim, J. Y.; Kim, S. H.; Lee, H.-H.; Lee, K.; Ma, W.; Gong, X.; Heeger, A. J. *Adv. Mater.* 2006, 18, 572.
(33) Verlaak, S.; Arkhipov, V.; Heremans, P. *Appl. Phys. Lett.* 2003, 82, 745.
(34) Wang, D.; Reese, M.; Kopidakis, N.; Gregg, B. A. In *Do the defects make it work? Defect engineering in pi-conjugated polymers and their solar cells*, 33rd IEEE Photovoltaic Specialists Conference, San Diego, Calif., 2008; San Diego, Calif., 2008; p 1.
(35) Peumans, P.; Forrest, S. R. *Chem. Phys. Lett.* 2004, 398, 27.
(36) Reese, M. O.; Morfa, A. J.; White, M. S.; Kopidakis, N.; Shaheen, S. E.; Rumbles, G.; Ginley, D. S. *Sol. Energy Mater. Sol. Cells* 2008, 92, 746.
(37) Shaheen, S. E. In *Mechanisms of Operation and Degradation in Solution-Processable Organic Photovoltaics*, IEEE 45th Annual International Reliability Physics Symposium, Phoenix, Ariz., 2007; Phoenix, Ariz., 2007; p 1.
(38) Koetse, M. M.; Sweelssen, J.; Franse, T.; Veenstra, S. C.; Kroon, J. M.; Yang, X.; Alexeev, A.; Loos, J.; Schubert, U. S.; Schoo, H. F. M. *Proc. SPIE-Int. Soc. Opt. Eng.* 2004, 5215, 119.
(39) Xu, M. S.; Xu, J. B. *J. Phys. D: Appl. Phys.* 2004, 37, 1603.
(40) Paniagua, S. A.; Hotchkiss, P. J.; Jones, S. C.; Marder, S. R.; Mudalige, A.; Marrikar, F. S.; Pemberton, J. E.; Armstrong, N. R. *J. Phys. Chem. C* 2008, 112, 7809.
(41) Li, Z. R.; Meng, H., *Organic Light-Emitting Materials and Devices* CRC: Boca Raton, Fla., 2006.
(42) Yan, H.; Lee, P.; Armstrong, N. R.; Graham, A.; Evmenenko, G. A.; Dutta, P.; Marks, T. J. *J. Am. Chem. Soc.* 2005, 127, 3172.
(43) Huang, Q.; Evmenenko, G. A.; Dutta, P.; Lee, P.; Armstrong, N. R.; Marks, T. J. *J. Am. Chem. Soc.* 2005, 127, 10227.
(44) Adamovich, V.; Brooks, J.; Tamayo, A.; Alexander, A. M.; Djurovich, P. I.; D'Andrade, B. W.; Adachi, C.; Forrest, S. R.; Thompson, M. E. *New J. Chem.* 2002, 26, 1171.
(45) Irwin, M. D.; Buchholz, D. B.; Leever, B. J.; Liu, J.; Emery, J. D.; Zhang, M.; Song, J.-H.; Durstock, M. F.; Freeman, A. J.; Bedzyk, M. J.; Hersam, M. C.; Chang, R. P. H.; Marks, T. J. *J. Am. Chem. Soc.* 2009, in press.
(46) Rider, D. A.; Harris, K. D.; Wang, D.; Bruce, J.; Fleischauer, M. D.; Tucker, R. T.; Brett, M. J.; Buriak, J. M. *ACS Appl. Mater. Interfaces* 2009, 1, 279.
(47) Li, N.; Lassiter, B. E.; Lunt, R. R.; Wei, G.; Forrest, S. R. *Appl. Phys. Lett.* 2009, 94, 023307.
(48) Kim, D. Y.; Subbiah, J.; Sarasqueta, G.; So, F.; Ding, H.; Irfan; Gao, Y. *Appl. Phys. Lett.* 2009, 95, 093304.
(49) Yamakawa, S.; Tajima, K.; Hashimoto, K. *Org. Electron.* 2009, 10, 511.
(50) Kang, B.; Tan, L. W.; Silva, S. R. P. *Appl. Phys. Lett.* 2008, 93, 133302.
(51) Hwang, E.; da Silva, K. M. N.; Seevers, C. B.; Li, J.-R.; Garno, J. C.; Nesterov, E. E. *Langmuir* 2008, 24, 9700.
(52) Marrikar, F. S.; Brumbach, M.; Evans, D. H.; Lebron-Paler, A.; Pemberton, J. E.; Wysocki, R. J.; Armstrong, N. R. *Langmuir* 2007, 23, 1530.
(53) Shrotriya, V.; Li, G.; Yao, Y.; Chu, C.-W.; Yang, Y. *Appl. Phys. Lett.* 2006, 88, 073508.
(54) Brabec, C. J.; Shaheen, S. E.; Winder, C.; Sariciftci, N. S. *Appl. Phys. Lett.* 2002, 80, 1288.
(55) Ahlswede, E.; Hanisch, J.; Powalla, M. *Appl. Phys. Lett.* 2007, 90, 163504.
(56) Li, G.; Chu, C.-W.; Shrotriya, V.; Huang, J.; Yang, Y. *Appl. Phys. Lett.* 2006, 88, 253503.
(57) Peumans, P.; Forrest, S. R. *Appl. Phys. Lett.* 2001, 79, 126.
(58) Lee, T.-W.; Chung, Y. *Adv. Funct. Mater.* 2008, 18, 2246.
(59) de Kok, M. M.; Buechel, M.; Vulto, S. I. E.; van de Weijer, P.; Meulenkamp, E. A.; de Winter, S. H. P. M.; Mank, A. J. G.; Vorstenbosch, H. J. M.; Weijtens, C. H. L.; van Elsbergen, V. *Phys. Status Solidi A* 2004, 201, 1342.
(60) Brown, T. M.; Kim, J. S.; Friend, r. H.; Cacialli, F.; Daik, R.; Feast, W. J. *Appl. Phys. Lett.* 1999, 75, 1679.
(61) Kemerink, M.; Timpanaro, S.; de Kok, M. M.; Meulenkamp, E. A.; Touwslager, F. J. *J. Phys. Chem. B* 2004, 108, 18820.
(62) Ionescu-Zanetti, C.; Mechler, A.; Carter, S. A.; Lal, R. *Adv. Mater.* 2004, 16, 385.
(63) de Jong, M. P.; van Ijzendoorn, L. J.; de Voigt, M. J. A. *Appl. Phys. Lett.* 2000, 77, 2255.
(64) Wong, K. W.; Yip, H. L.; Luo, Y.; Wong, K. Y.; Lau, W. M.; Low, K. H.; Chow, H. F.; Gao, Z. Q.; Yeung, L.; Chang, C. C. *Appl. Phys. Lett.* 2002, 80, 2788.
(65) Ni, J.; Yan, H.; Wang, A.; Yang, Y.; Stern, C. L.; Metz, A. W.; Jin, S.; Wang, L.; Marks, T. J.; Ireland, J. R.; Kannewurf, C. R. *J. Am. Chem. Soc.* 2005, 127, 5613.
(66) Greczynski, G.; Kugler, T.; Keil, M.; Osikowicz, W.; Fahlman, M.; Salaneck, W. R. *J. Electron. Spectrosc. Relat. Phenom.* 2001, 121, 1.
(67) Pangborn, A. B.; Giardello, M. A.; Grubbs, R. H.; Rosen, R. K.; Timmers, F. J. *Organometallics* 1996, 15, 1518.
(68) Mozer, A. J.; Denk, P.; Scharber, M. C.; Neugebauer, H.; Sariciftci, N. S.; Wagner, P.; Lutsen, L.; Vanderzande, D. *J. Phys. Chem. B* 2004, 108, 5235.
(69) Izadyar, A.; Omer, K. M.; Liu, Y.; Chen, S.; Xu, X.; Bard, A. J. *J. Phys. Chem. C* 2008, 112, 20027.
(70) Debad, J. D.; Morris, J. C.; Magnus, P.; Bard, A. B. *J. Org. Chem.* 1997, 62, 530.
(71) Tonzola, C. J.; Alam, M. M.; Kaminsky, W.; Jenekhe, S. A. *J. Am. Chem. Soc.* 2003, 125, 13548.
(72) Kulkarni, A. P.; Tonzola, C. J.; Babel, A.; Jenekhe, S. A. *Chem. Mater.* 2004, 16, 4556.
(73) Poriel, C.; Liang, J.-J.; Rault-Berthelot, J.; Barrière, F.; Cocherel, N.; Slawin, A. M. Z.; Horhant, D.; Virboul, M.; Alcaraz, G.; Audebrand, N.; Vignau, L.; Huby, N.; Wantz, G.; Hirsch, L. *Chem. Eur. J.* 2007, 13, 10055.
(74) Shrotriya, V.; Li, G.; Yao, Y.; Moriarty, T.; Emery, K.; Yang, Y. *Adv. Funct. Mater.* 2006, 16, 2016.
(75) Curtis, R. F.; Phillips, G. T. *J. Chem. Soc.* 1965, 5134.
(76) Tour, J. M.; Wu, R. *Macromolecules* 1992, 25, 1901.
(77) Irwin, M. D.; Liu, J.; Leever, B. J.; Hersam, M. C.; Durstock, M. F.; Marks, T. J., submitted.
(78) Kong, J.; White, C. A.; Krylov, A. I.; Sherrill, D.; Adamson, R. D.; Furlani, T. R.; Lee, M. S.; Lee, A. M.; Gwaltney, S. R.; Adams, T. R.; Ochsenfeld, C.; Gilbert, A. T. B.; Kedziora, G. S.; Rassolov, V. A.; Maurice, D. R.; Nair, N.;

Shao, Y.; Besley, N. A.; Maslen, P. E.; Dombroski, J. P.; Daschel, H.; Zhang, W.; Korambath, P. P.; Baker, J.; Byrd, E. F. C.; Voorhis, T. V.; Oumi, M.; Hirata, S.; Hsu, C.-P.; Ishikawa, N.; Florian, J.; Warshel, A.; Johnson, B. G.; Gill, P. M. W.; Head-Gordon, M.; Pople, J. A. *J. Comput. Chem.* 2000, 21, 1532.

(79) Maldonado, J.-L.; Bishop, M.; Fuentes-Hernandez, C.; Caron, P.; Domercq, B.; Zhang, Y.-D.; Barlow, S.; Thayumanavan, S.; Malagoli, M.; Brédas, J.-L.; Marder, S. R.; Kippelen, B. *Chem. Mater.* 2003, 15, 994.

(80) Smeu, M.; Wolkow, R. A.; KiLabio, G. A. *J. Chem. Phys.* 2008, 129, 034707.

(81) DiLabio, G. A.; Pratt, D. A.; Wright, J. S. *J. Org. Chem.* 2000, 65, 2195.

(82) Rohde, D.; Dunsch, L.; Tabet, A.; Hartmann, H.; Fabian, J. *J. Phys. Chem. B* 2006, 110, 8223.

(83) Li, J.; Wang, L.; Liu, J.; Evmenenko, G.; Dutta, P.; Marks, T. J. *Langmuir* 2008, 24, 5755.

(84) Huang, Q.; Li, J.; Marks, T. J.; Evmenenko, G. A.; Dutta, P. *J. Appl. Phys.* 2007, 101, 093101.

(85) Cui, J.; Huang, Q.; Veinot, J. C. G.; Yan, H.; Wang, Q.; Hutchinson, G. R.; Richter, A. G.; Evmenenko, G.; Dutta, P.; Marks, T. J. *Langmuir* 2002, 18, 9958.

(86) Louie, J.; Hartwig, J. F. *Tetrahedron Lett.* 1995, 36, 3609.

(87) Guram, A. S.; Rennels, R. A.; Buchwald, S. L. *Angew. Chem. Int. Ed.* 1995, 34, 1348.

(88) Driver, M. S.; Hartwig, J. F. *J. Am. Chem. Soc.* 1996, 118, 7217.

(89) Wolfe, J. P.; Wagaw, S.; Buchwald, S. L. *J. Am. Chem. Soc.* 1996, 118, 7215.

(90) Hartwig, J. F. *Angew. Chem. Int. Ed.* 1998, 37, 2046.

(91) Yang, B. H.; Buchwald, S. L. *J. Organomet. Chem.* 1999, 576, 125.

(92) Hooper, M. W.; Utsunomiya, M.; Hartwig, J. F. *J. Org. Chem.* 2002, 68, 2861.

(93) Huang, Q.; Li, J.; Evmenenko, G. A.; Dutta, P.; Marks, T. J. *Chem. Mater.* 2006, 18, 2431.

(94) Bard, A. J.; Faulkner, L. R., *Electrochemical Methods: Fundamentals and Applications.* 2nd ed.; John Wiley & Sons, Inc.: New York, N.Y., 2001.

(95) Chambon, S.; Rivaton, A.; Gardette, J.-L.; Firon, M. *Sol. Energy Mater. Sol. Cells* 2008, 92, 785.

(96) Shrotriya, V.; Ouyang, J.; Tseng, R. J.; Li, G.; Yang, Y. *Chem. Phys. Lett.* 2005, 411, 138.

(97) Mihailetchi, V. D.; Wildeman, J.; Blom, P. W. M. *Phys. Rev. Lett.* 2005, 94, 126602.

(98) Yan, H.; Yoon, M.-H.; Facchetti, A.; Marks, T. J. *Appl. Phys. Lett.* 2005, 87, 183501.

(99) We recognize that the charge transfer directions in OFETs and OPVs are parallel to, and perpendicular to, respectively, the substrate plane. However, there is no evidence that the film microstructures are in any way anisotropic.

(100) Mihailetchi, V. D.; Blom, P. W. M.; Hummelen, J. C.; Rispens, M. T. *J. Appl. Phys.* 2003, 94, 6849.

(101) Aernouts, T.; Geens, W.; Poortmans, J.; Heremans, P.; Borghs, S.; Mertens, R. *Thin Solid Films* 2002, 403-404, 297.

(102) Smith, A. P.; Smith, R. R.; Taylor, B. E.; Durstock, M. F. *Chem. Mater.* 2004, 16, 4687.

(103) Yang, X.; Loos, J. *Macromolecules* 2007, 40, 1353.

(104) van Bavel, S. S.; Sourty, E.; de With, G.; Loos, J. *Nano Lett.* 2009, 9, 507.

(105) Mayer, A. C.; Toney, M. F.; Scully, S. R.; Rivnay, J.; Brabec, C. J.; Scharber, M.; Koppe, M.; Heeney, M.; McCulloch, I.; McGehee, M. D. *Adv. Funct. Mater.* 2009, 19, 1.

(106) Kim, Y.; Choulis, S. A.; Nelson, J.; Bradley, D. D. C.; Cook, S.; Durrant, J. R. *Appl. Phys. Lett.* 2005, 86, 063502.

(107) Bernède, J. C. *J. Chil. Chem. Soc.* 2008, 53, 1549.

(108) Vogel, M.; Doka, S.; Breyer., C.; Lux-Steiner, M. C.; Fostiropoulos, K. *Appl. Phys. Lett.* 2006, 89, 163501.

What is claimed is:

1. An organic photovoltaic device, comprising:
   (a) an anode;
   (b) a cathode;
   (c) an active layer disposed between the anode and the cathode; and
   (d) an interfacial layer disposed between the anode and the active layer, the interfacial layer comprising 5,5'-bis[(p-trichlorosilylpropylphenyl)phenylamino]-2,2'-bithiophene (PABTSi$_2$).

2. The organic photovoltaic device of claim 1, wherein the active layer comprises poly(3-hexylthiophene) (P3HT).

3. The organic photovoltaic device of claim 2, wherein the active layer further comprises [6,6]-phenyl-C$_{61}$-butyric acid methyl ester (PCBM).

4. The organic photovoltaic device of claim 3, wherein the ratio of P3HT and PCBM is about 1:1 by weight.

5. The organic photovoltaic device of claim 1, wherein the interfacial layer further comprises poly[9,9-dioctylfluorene-co-N-[4-(3-methylpropyl)]-diphenylamine] (TFB).

6. The organic photovoltaic device of claim 5, wherein PABTSi$_2$ and TFB are cross-linked and blended.

7. The organic photovoltaic device of claim 5, wherein the ratio of PABTSi$_2$ and TFB is less than 1 by weight.

8. The organic photovoltaic device of claim 7, wherein the ratio of PABTSi$_2$ and TFB is about 1:2.

9. The organic photovoltaic device of claim 7, wherein the ratio of PABTSi$_2$ and TFB is about 1:3.

10. The organic photovoltaic device of claim 1, wherein the interfacial layer has a thickness in the range between about 20 nm and 50 nm.

11. The organic photovoltaic device of claim 1, wherein the anode comprises indium tin oxide (ITO).

12. The organic photovoltaic device of claim 1, wherein the cathode comprises aluminum (Al).

13. The organic photovoltaic device of claim 1, further comprising a layer of lithium fluoride (LiF) disposed between the active layer and the cathode.

14. A method of fabricating an organic photovoltaic device, comprising the steps of:
    (a) forming an anode;
    (b) depositing an interfacial layer on the anode, the interfacial layer comprising 5,5'-bis[(p-trichlorosilylpropylphenyl)phenylamino]-2,2'-bithiophene (PABTSi$_2$);
    (c) depositing an active layer on the interfacial layer; and
    (d) forming a cathode on the active layer.

15. The method of claim 14, wherein the active layer comprises poly(3-hexylthiophene) (P3HT).

16. The method of claim 15, wherein the active layer further comprises [6,6]-phenyl-C$_{61}$-butyric acid methyl ester (PCBM).

17. The method of claim 16, wherein the ratio of P3HT and PCBM is about 1:1 by weight.

18. The method of claim 14, wherein the interfacial layer further comprises poly[9,9-dioctylfluorene-co-N-[4-(3-methylpropyl)]-diphenylamine] (TFB).

19. The method of claim 18, wherein PABTSi$_2$ and TFB are cross-linked and blended.

20. The method of claim 18, wherein the ratio of PABTSi$_2$ and TFB is less than 1 by weight.

21. The method of claim 20, wherein the ratio of PABTSi$_2$ and TFB is about 1:2.

22. The method of claim 20, wherein the ratio of PABTSi$_2$ and TFB is about 1:3.

23. The method of claim 14, wherein the interfacial layer has a thickness in the range between about 20 nm and 50 nm.

24. The method of claim 18, wherein the step of depositing an interfacial layer comprises the step of spin-coating a film of PABTSi$_2$:TFB on the anode using a solvent.

25. The method of claim 24, wherein the solvent is chlorobenzene (CB).

26. The method of claim 24, wherein the step of depositing an interfacial layer further comprises annealing the film at an annealing temperature above 20° C. subsequent to the step of spin-coating.

27. The method of claim 26, wherein the annealing temperature is between about 60° C. and 150° C.

28. The method of claim 16, wherein the step of depositing an active layer comprises the step of spin-coating a film of P3HT:PCBM on the interfacial layer using o-dichlorobenzene (ODCB) as a solvent.

29. The method of claim 14, wherein the anode comprises indium tin oxide (ITO).

30. The method of claim 14, wherein the cathode comprises aluminum (Al).

31. The method of claim 14, further comprising the step of depositing a layer of lithium fluoride (LiF) on the active layer prior to forming a cathode.

32. An article of manufacture made by the method of claim 14.

33. An article of manufacture comprising a layer that comprises 5,5'-bis[(p-trichlorosilylpropylphenyl)phenylamino]-2,2'-bithiophene (PABTSi$_2$).

34. The article of manufacture of claim 33, wherein the layer further comprises poly[9,9-dioctylfluorene-co-N-[4-(3-methylpropyl)]-diphenylamine] (TFB).

35. The article of manufacture of claim 34, wherein PABTSi$_2$ and TFB are cross-linked and blended.

36. The article of manufacture of claim 35 is an organic field-effect transistor.

37. The article of manufacture of claim 35 comprising an organic field-effect transistor that has the layer.

* * * * *